United States Patent [19]
Fujii

[11] Patent Number: 5,606,525
[45] Date of Patent: Feb. 25, 1997

[54] DATA REGISTER STRUCTURE AND SEMICONDUCTOR INTEGRATED CIRCUIT DEVICE USING THE SAME

[75] Inventor: Yayoi Fujii, Kawasaki, Japan

[73] Assignee: Fujitsu Limited, Kawasaki, Japan

[21] Appl. No.: 552,459

[22] Filed: Nov. 9, 1995

Related U.S. Application Data

[63] Continuation of Ser. No. 231,678, Apr. 25, 1994, abandoned.

[30] Foreign Application Priority Data

Jun. 4, 1993 [JP] Japan .................................. 5-134973

[51] Int. Cl.$^6$ .................................................. G11C 7/00
[52] U.S. Cl. .................... 365/189.04; 365/230.03; 365/230.06
[58] Field of Search ...................... 365/230.03, 230.01, 365/230.06, 189.01, 189.04

[56] References Cited

U.S. PATENT DOCUMENTS

| | | | |
|---|---|---|---|
| 3,968,480 | 7/1976 | Stein | 340/173 |
| 4,488,264 | 12/1984 | Dshkhunian et al. | 365/189 |
| 5,226,142 | 7/1993 | Vegesna et al. | 395/425 |
| 5,241,510 | 8/1993 | Kobayashi et al. | 365/230.03 |
| 5,287,485 | 2/1994 | Umina et al. | 365/230.03 X |
| 5,291,453 | 3/1994 | Aota et al. | 365/230.03 X |
| 5,301,162 | 4/1994 | Shimizu | 365/230.03 |

*Primary Examiner*—Do Hyun Yoo
*Attorney, Agent, or Firm*—Armstrong, Westerman, Hattori, McLeland & Naughton

[57] ABSTRACT

A data register structure includes a plurality of memory cells connected to a word line and grouped into groups assigned to respective different addresses, each of the memory cells being connected to first and second bit lines paired, a write control unit for controlling potentials of the first and second bit lines connected to memory cells into which data is to be written, and a read control unit for detecting potentials of either first or second bit lines connected to memory cells from which data is to be read.

13 Claims, 21 Drawing Sheets

DATA REGISTER STRUCTURE AND SEMICONDUCTOR INTEGRATED CIRCUIT DEVICE USING THE SAME

This application is a continuation of application Ser. No. 08/231,678 filed Apr. 25, 1994, now abandoned.

BACKGROUND OF THE INVENTION

1. Field of the Invention

The present invention generally relates to semiconductor integrated circuit devices, and more particularly to a semiconductor integrated circuit device such as a one-chip microcomputer device. More specifically, the present invention relates to a data register provided in a data processing device such as a one-chip microcomputer.

2. Description of the Prior Art

FIG. 1 shows a one-chip microcomputer device. As shown in FIG. 1, the device includes a chip body 1, a CPU (Central Processing Unit) 2, a ROM (Read Only Memory) 3, a RAM (Random Access Memory) 4, a peripheral circuit 5, and an I/O (Input/Output) port 6. The ROM 3 is mainly used to store programs executed by the CPU 2. The RAM 4 is mainly used to temporarily store data. The peripheral circuit 5 is, for example, an A/D (Analog-to-Digital) converter, or a D/A (Digital-to-Analog) converter.

The CPU 2 is configured as shown in FIG. 2 which shows an essential part of the CPU 2. A program counter (PC) 7 outputs the address of an instruction to be fetched. An instruction register (IR) 8 stores the taken-out instruction. An instruction decoder (DEC) 9 decodes the instruction stored in the instruction register 8. A data register (DR) 10 is used as a "note or working area". An arithmetic and logic unit (ALU) 11 performs arithmetic and logical operations. Read data is output to read buses 12 and 13. A write bus 14 is used to supply the data register 10 with write data to be written into the data register 10.

FIG. 3 shows an essential part of the data register 10. As shown in FIG. 3, the data register 10 includes memory cells $15_{11}$ through $15_{45}$, write-use word $WL_{12}$, $WL_{22}$, $WL_{32}$, $WL_{42}$, $WL_{13}$, $WL_{23}$, $WL_{33}$, and $WL_{43}$. lines $WL_{11}$, $WL_{21}$, $WL_{31}$, $WL_{41}$, and read-use word lines Further, the data register 10 includes write-use bit lines $BL_{11}$, $BL_{12}$, $BL_{21}$, $BL_{22}$, $BL_{31}$, $BL_{32}$, $BL_{41}$, $BL_{42}$, $BL_{51}$ and $BL_{52}$, read-use bit lines $BL_{13}$, $BL_{14}$, $BL_{23}$, $BL_{24}$, $BL_{33}$, $BL_{34}$, $BL_{43}$, $BL_{44}$, $BL_{53}$ and $BL_{54}$.

The memory cells $15_{11}$ through $15_{45}$ have an identical circuit configuration. By way of example, the memory cell $15_{11}$ is shown in FIG. 4. The memory cell $15_{11}$ has an SRAM (Static Random Access Memory) cell structure, and includes a flip-flop 16 having two inverters 17 and 18 connected in a ring formation, two nMOS (n-channel Metal Oxide Semiconductor) transistors 19 and 20 for use in writing data, and two nMOS transistors 21 and 22 for use in reading data. These transistors 19–22 function as transfer gates.

When data is written into the memory cell $15_{11}$, the word line $WL_{11}$ is switched to a high (H) level and the word lines $WL_{12}$ and $WL_{13}$ are switched to a low (L) level. The nMOS transistors 19 and 20 are turned ON, and the nMOS transistors 21 and 22 are turned OFF. Further, one of the bit lines $BL_{11}$ and $BL_{12}$ is switched to the high level and the other bit line is switched to the low level on the basis of the binary value indicated by data to be written into the memory cell $15_{11}$.

When data is read from the memory cell $15_{11}$ via the bit line $BL_{13}$, the bit line $BL_{13}$ is reset to the high level via a load. Further, the word line $WL_{11}$ and $WL_{13}$ are switched to the low level, and the word line $WL_{12}$ is switched to the high level. Thus, the nMOS transistors 19, 20 and 22 are turned OFF, and the nMOS transistor 21 is turned ON. Hence, the potential of the bit line $BL_{13}$ is detected.

When data is read from the memory cell $15_{11}$ via the bit line $BL_{14}$, the bit line $BL_{14}$ is reset to the high level via a load. Further, the word lines $WL_{11}$ and $WL_{12}$ are switched to the low level and the word line $WL_{13}$ is switched to the high level. Thus, the nMOS transistors 19, 20 and 21 are turned OFF, and the nMOS transistor 22 is turned ON. Hence, the potential of the bit line $BL_{14}$ is detected.

Turning to FIG. 3 again, the data register 10 includes an address decoder 23 for selecting the write-use word lines $WL_{11}$, $WL_{21}$, $WL_{31}$, $WL_{41}$, an address decoder 24 for selecting the read-use word lines $WL_{12}$, $WL_{22}$, $WL_{32}$, $WL_{42}$, an address decoder 25 for selecting the read use word lines $WL_{13}$, $WL_{23}$, $WL_{33}$, and $WL_{43}$. Further, the data register 10 includes a write selector 26 for selecting the write-use bit lines $BL_{11}$, $BL_{12}$, $BL_{21}$, $BL_{22}$, $BL_{31}$, $BL_{32}$, $BL_{41}$, $BL_{42}$, $BL_{51}$ and $BL_{52}$ in order to write data, and a decoder 27, which decodes a control signal supplied from the instruction decoder 9 and hence controls the selecting operation of the write selector 26. Further, the data register 10 includes read selector 28 and 30 for selecting the read-use bit lines $BL_{13}$, $BL_{14}$, $BL_{23}$, $BL_{24}$, $BL_{33}$, $BL_{34}$, $BL_{43}$, $BL_{44}$, $BL_{53}$ and $BL_{54}$ in order to read data, and decoder 29 and 31, which decode the control signals supplied from the instruction decoder 9 and hence controls the selecting operation of the read selector 28 and 30.

The writing via the write selector 26 and reading via the read selectors 28 and 30 can be simultaneously carried out under the condition that two word lines or more are not concurrently selected for the same row (the same address viewed from the address decoders 23–25). For example, the write operation on the memory cells $15_{11}$–$15_{15}$ specified by address 0 via the write selector 26, the first read operation on the memory cells $15_{21}$–$15_{25}$ specified by address 1 via the read selector 28, and the second read operation on the memory cells $15_{31}$–$15_{35}$ specified by address 2 via the read selector 30 can be simultaneously performed. The above-mentioned one-write two-read operation is needed to process instructions in a pipeline formation.

The memory cell shown in FIG. 4 uses four nMOS transistors 19–22, and hence the data register 10 having a large number of memory cells occupies a large area on the chip and needs a large chip area.

SUMMARY OF THE INVENTION

It is a general object of the present invention to provide a data register structure and a semiconductor integrated circuit device in which the above disadvantage is eliminated.

A more specific object of the present invention is to provide a data register structure and a semiconductor integrated circuit device having a memory circuit part capable of simultaneously performing a data write with respect to one or a plurality of addresses and a data read with respect to one or a plurality of addresses, in which the memory circuit part has a memory cell occupying a reduced chip area, so that the chip size can be reduced.

These objects of the present invention are achieved by a data register structure comprising: a plurality of memory cells connected to a word line and grouped into groups assigned to respective different addresses, each of the memory cells being connected to first and second bit lines paired; write control means for controlling potentials of the first and second bit lines connected to memory cells into which data is to be written; and read control means for detecting potentials of either first or second bit lines connected to memory cells from which data is to be read.

The above objects of the present invention are achieved by a data register structure comprising: a plurality of blocks, each having a plurality of memory cells connected to a word line and grouped into groups assigned to respective different addresses, each of the memory cells being connected to first and second bit lines paired, the first and second bit lines being connected to and commonly used by at least two blocks; write control means for controlling potentials of the first and second bit lines connected to memory cells into which data is to be written; and read control means for detecting potentials of either first or second bit lines connected to memory cells from which data is to be read.

The above objects of the present invention are achieved by a semiconductor integrated circuit device comprising: a data register for storing data; and an operation unit for performing an operation on two data items read from the data register and writing an operation result into the data register, said data register comprising: a plurality of memory cells connected to a word line and grouped into groups assigned to respective different addresses, each of the memory cells being connected to first and second bit lines paired; write control means for controlling potentials of the first and second bit lines connected to memory cells into which data is to be written; and read control means for detecting potentials of either first or second bit lines connected to memory cells from which data is to be read.

The above objects of the present invention are achieved by a semiconductor integrated circuit device comprising: a data register for storing data; an operation unit for performing an operation on two data read from the data register and writing an operation result into the data register, said data register comprising: a plurality of blocks, each having a plurality of memory cells connected to a word line and grouped into groups assigned to respective different addresses, each of the memory cells being connected to first and second bit lines paired, the first and second bit lines being connected to and commonly used by at least two blocks; write control means for controlling potentials of the first and second bit lines connected to memory cells into which data is to be written; and read control means for detecting potentials of either first or second bit lines connected to memory cells from which data is to be read.

The above objects of the present invention are achieved by a semiconductor integrated circuit device comprising: a processor; and memory means for storing a program executed by the processor and data processed by the processor; said processor comprising: a data register for storing data; and an operation unit for performing an operation on two data items read from the data register and writing an operation result into the data register, said data register comprising: a plurality of memory cells connected to a word line and grouped into groups assigned to respective different addresses, each of the memory cells being connected to first and second bit lines paired; write control means for controlling potentials of the first and second bit lines connected to memory cells into which data is to be written; and read control means for detecting potentials of either first or second bit lines connected to memory cells from which data is to be read.

The above objects of the present invention are achieved by a semiconductor integrated circuit device comprising: a processor; and memory means for storing a program executed by the processor and data processed by the processor; said processor comprising: a data register for storing data; and an operation unit for performing an operation on two data read from the data register and writing an operation result into the data register, said data register comprising: a plurality of blocks, each having a plurality of memory cells connected to a word line and grouped into groups assigned to respective different addresses, each of the memory cells being connected to first and second bit lines paired, the first and second bit lines being connected to and commonly used by at least two blocks; write control means for controlling potentials of the first and second bit lines connected to memory cells into which data is to be written; and read control means for detecting potentials of either first or second bit lines connected to memory cells from which data is to be read.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
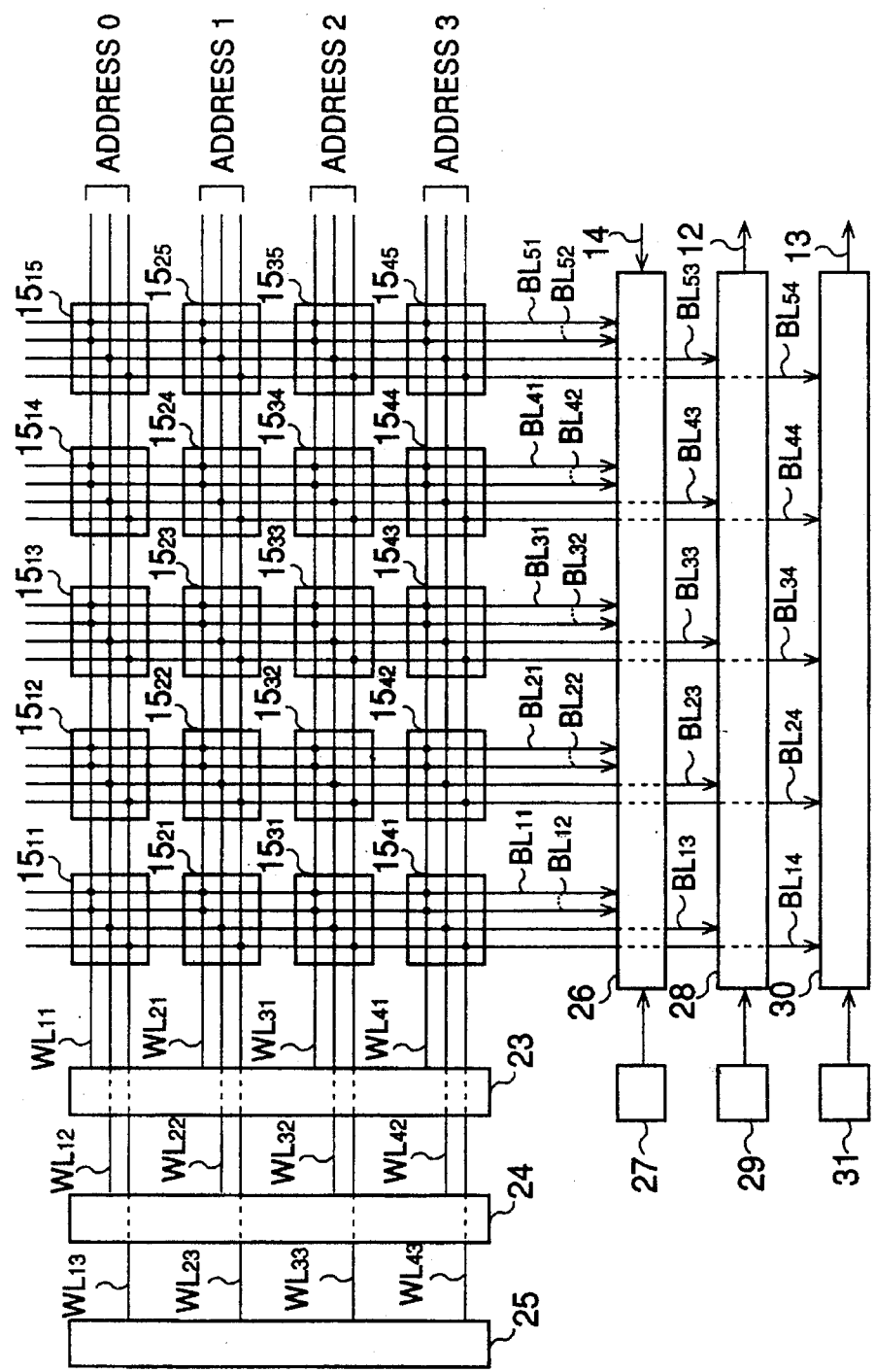
FIG. 3 is a block diagram of the structure of a data register shown in FIG. 1.
Figure 4:
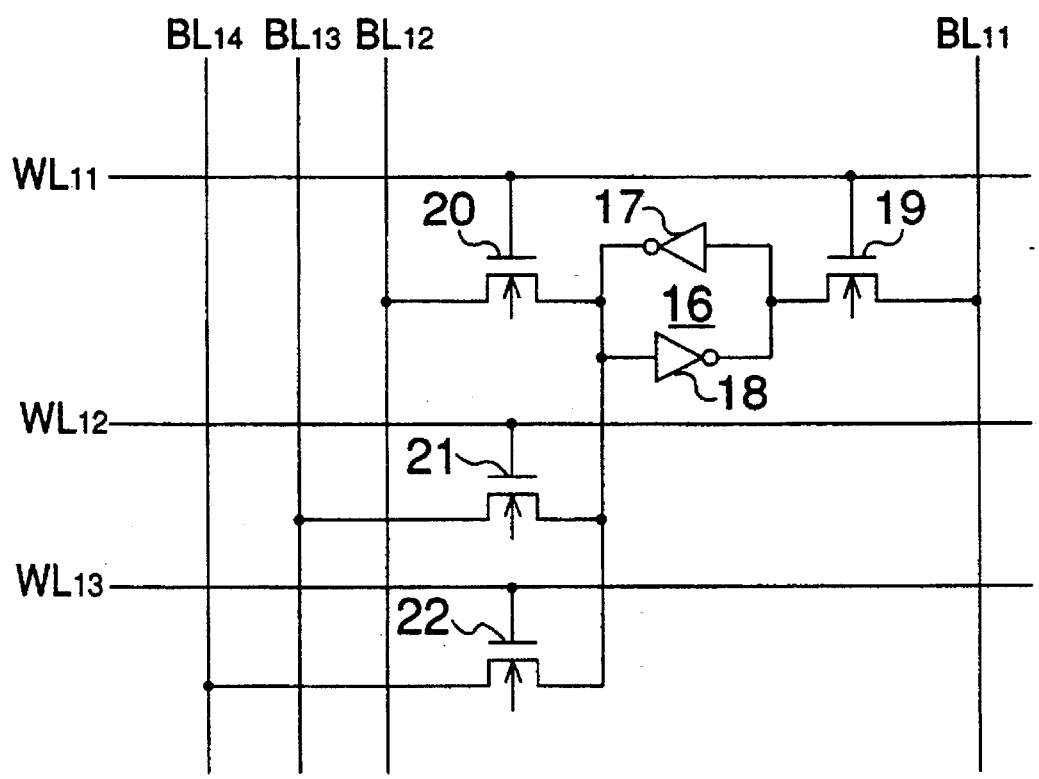
FIG. 4 is a circuit diagram of a memory cell provided in the data register shown in FIG. 3.
Figure 5:
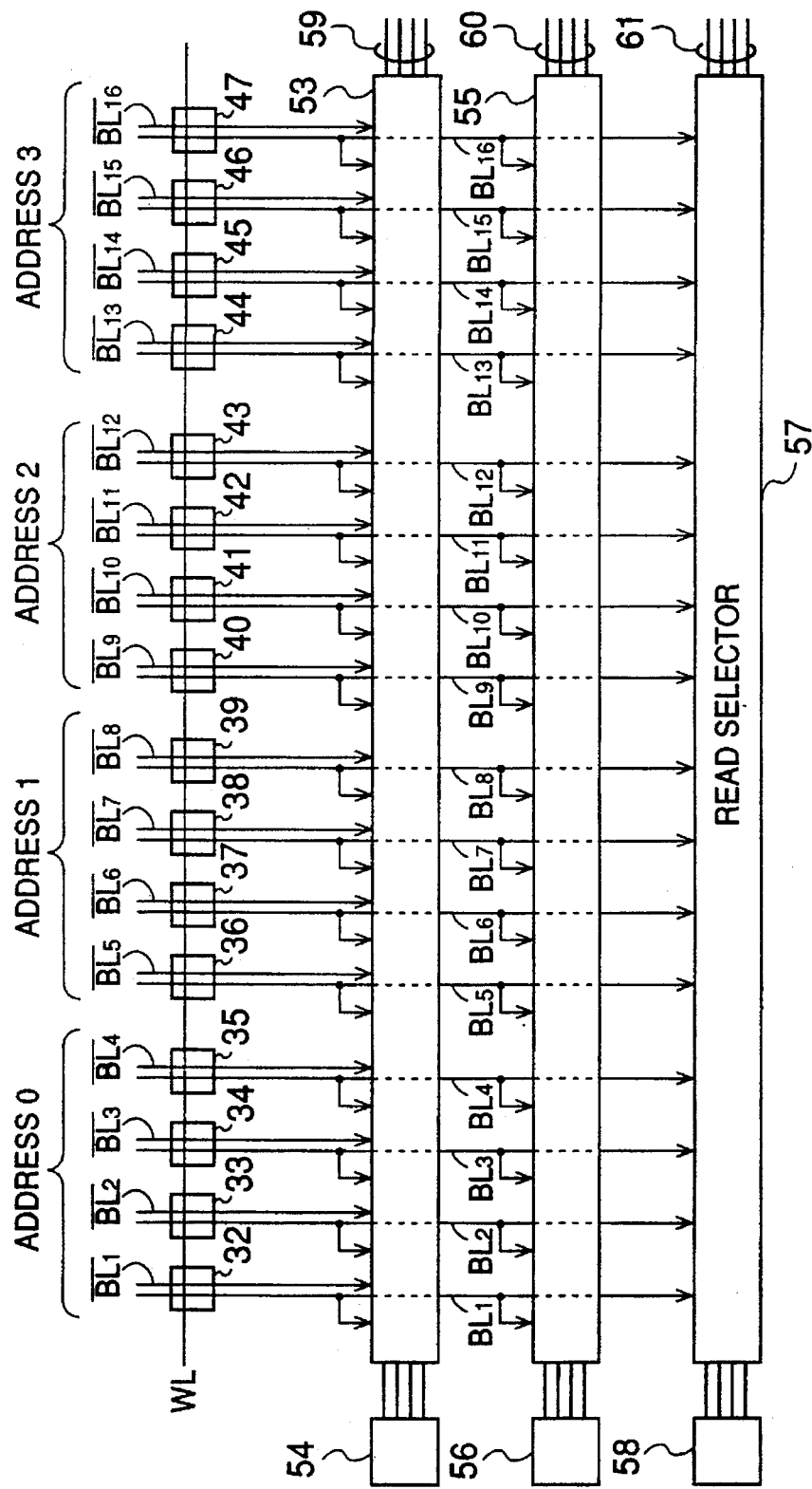
FIG. 5 is a block diagram of an essential part of a first embodiment of the present invention.

FIG. 5 shows an essential part of a first embodiment of the present invention, and more particularly the circuit configuration of a part of a data register provided in a CPU of a one-chip microcomputer. The configuration shown in FIG. 5 is substituted for the conventional configuration shown in FIG. 3. This means that the one-chip microcomputer according to the first embodiment of the present invention has the same block diagram as that shown in FIG. 3 except that the configurations of the data registers are different from each other.

The data register shown in FIG. 5 includes a group of memory cells 32–35 specified by address 0, a group of memory cells 36–39 specified by address 1, a group of memory cells 40–43 specified by address 2, and a group of memory cells 44–47 specified by address 3. These memory cells are connected to a word line WL and bit lines $BL_1$, $/BL_1$–$BL_{16}$ and $/BL_{16}$. The memory cells 32–47 have an identical SRAM circuit configuration.

Figure 6:
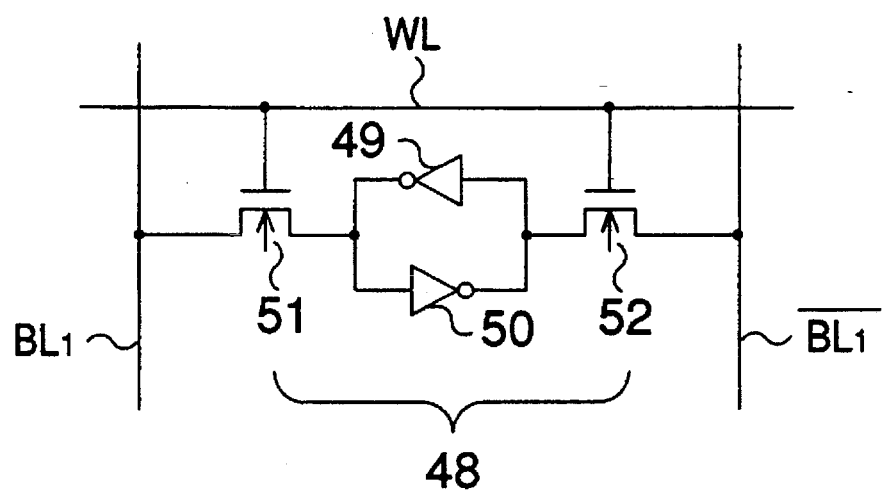
FIG. 6 is a circuit diagram of a memory cell used in embodiments of the present invention.

By way of example, the memory cell 32 is shown in FIG. 6. The memory cell 32 includes two inverters 49 and 50 connected in a ring formation, and nMOS transistors 51 and 52 respectively serving as transfer gates. When data is written into the memory cell 32, the word line WL is switched to the high level, and hence the nMOS transistors 51 and 52 are turned ON. One of the bit lines $BL_1$ and $/BL_1$ is switched to the high level and the other bit line is switched to the low level on the basis of the binary value of the data to be written. When data is read from the memory cell 32, the bit lines $BL_1$ and $/BL_1$ are reset to the high level via loads (not shown), and the word line WL is set to the high level. Hence, the nMOS transistors 51 and 52 are turned ON, and the potential of the bit line $BL_1$ is detected.

Figure 1:
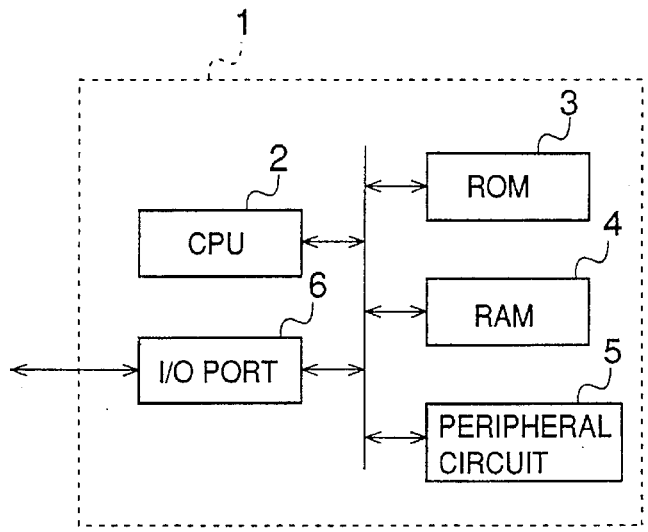
FIG. 1 is a block diagram of a conventional one-chip microcomputer.
Figure 2:
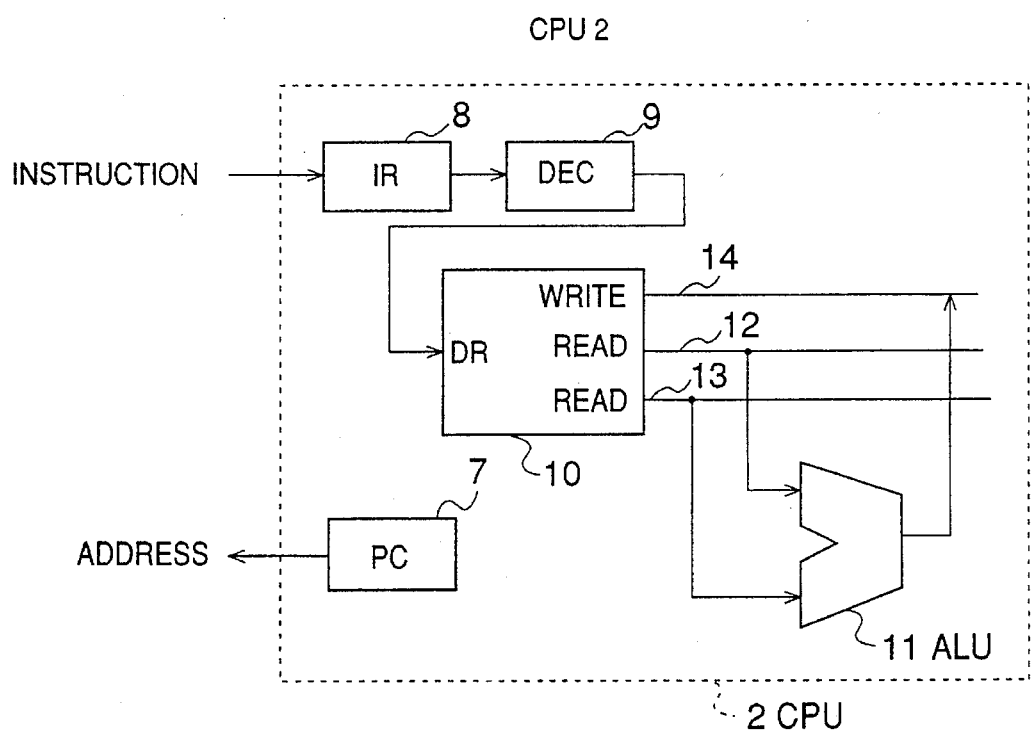
FIG. 2 is a block diagram of the structure of a CPU shown in FIG. 1.

Turning now to FIG. 5 again, the data register includes a write selector 53, which selects the bit lines to which the memory cells into which data is to be written, and writes the data therein. The data register includes an address decoder 54, which decodes the address signal supplied from the instruction decoder 9 shown in FIG. 2, and controls the selecting operation of the write selector 53. The data register shown in FIG. 5 includes a read selector 57, which selects the bit lines connected to the memory cells from which data is to be read, and reads the data therefrom. The data register includes an address decoder 58, which decodes the address signal supplied from the instruction decoder 9, and controls the selecting operation of the read selector 57.

Further, the data register shown in FIG. 5 includes a write bus 59 via which write data is transferred to the write selector 53, a read bus 60 via which data read via the read selector 55 is transferred, and a read bus 61 via which data read via the read selector 57 is transferred.

Figure 7:
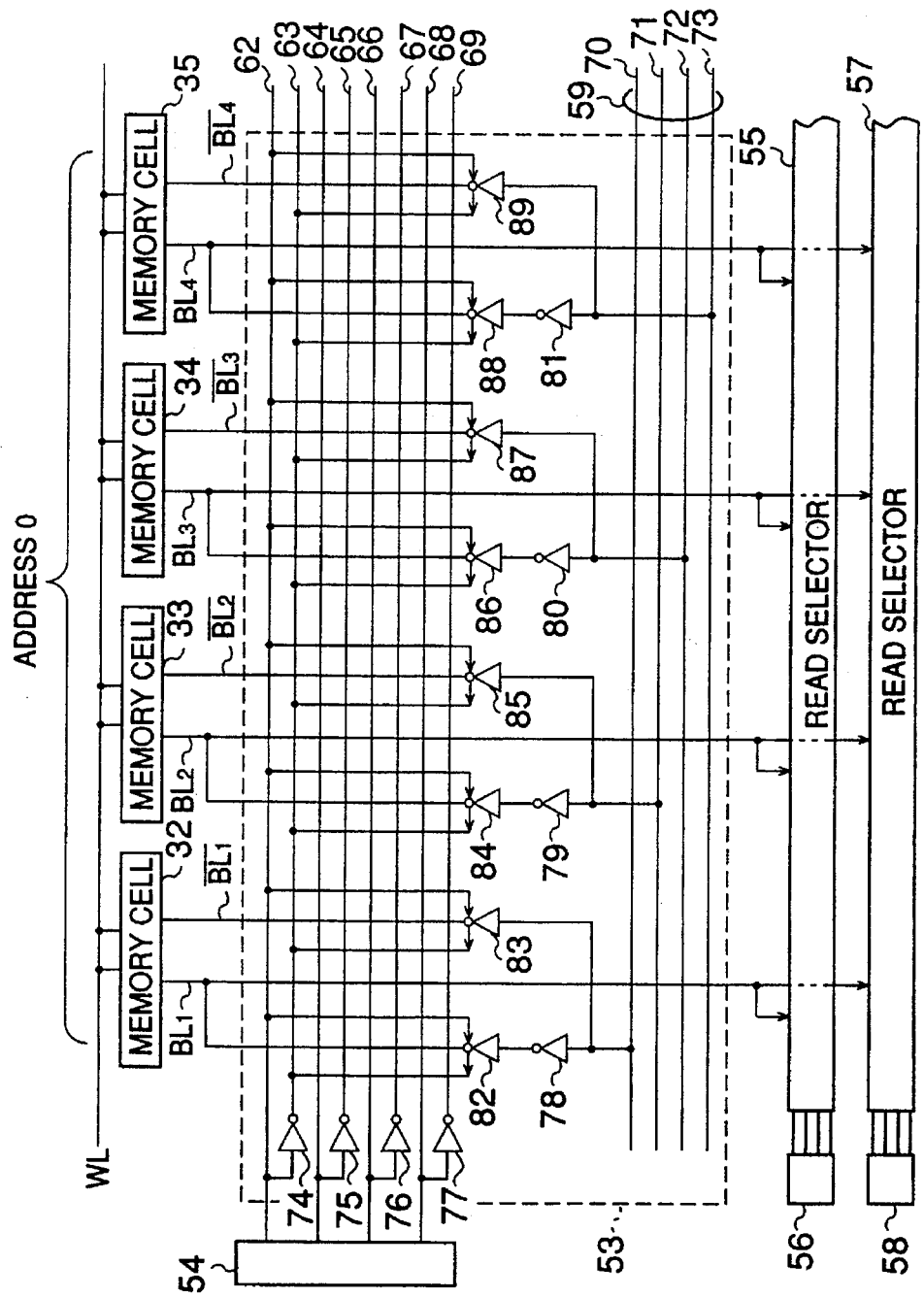
FIG. 7 is a block diagram of a first part of a write selector used in the first embodiment of the present invention.

FIGS. 7 through 10 show segmented parts of the write selector 53. As shown in FIG. 7, the data register shown in FIG. 5 includes bit line selecting lines 62 and 63 used to select bit lines $BL_1$, $/BL_1$, $BL_2$, $/BL_2$, $BL_3$, $/BL_3$, $BL_4$ and $/BL_4$, these bit lines being connected to the memory cells 32, 33, 34 and 35 having address 0.

Figure 8:
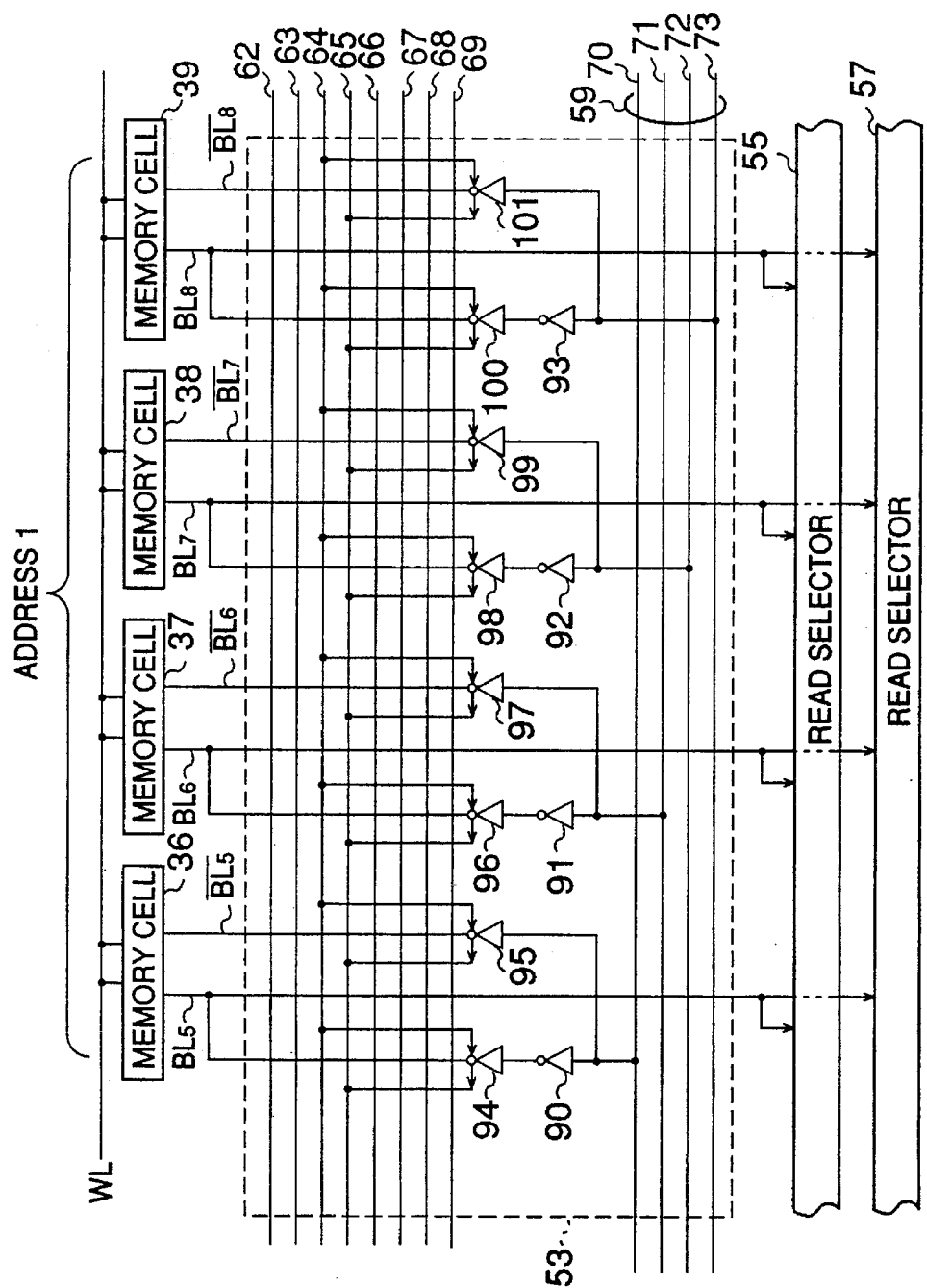
FIG. 8 is a block diagram of a second part of the write selector used in the first embodiment of the present invention.

As shown in FIG. 8, the data register shown in FIG. 5 includes bit line selecting lines 64 and 65 used to select bit lines $BL_5$, $/BL_5$, $BL_6$, $/BL_6$, $BL_7$, $/BL_7$, $BL_8$ and $/BL_8$, these bit lines being connected to the memory cells 36, 37, 38 and 39 having address 1.

Figure 9:
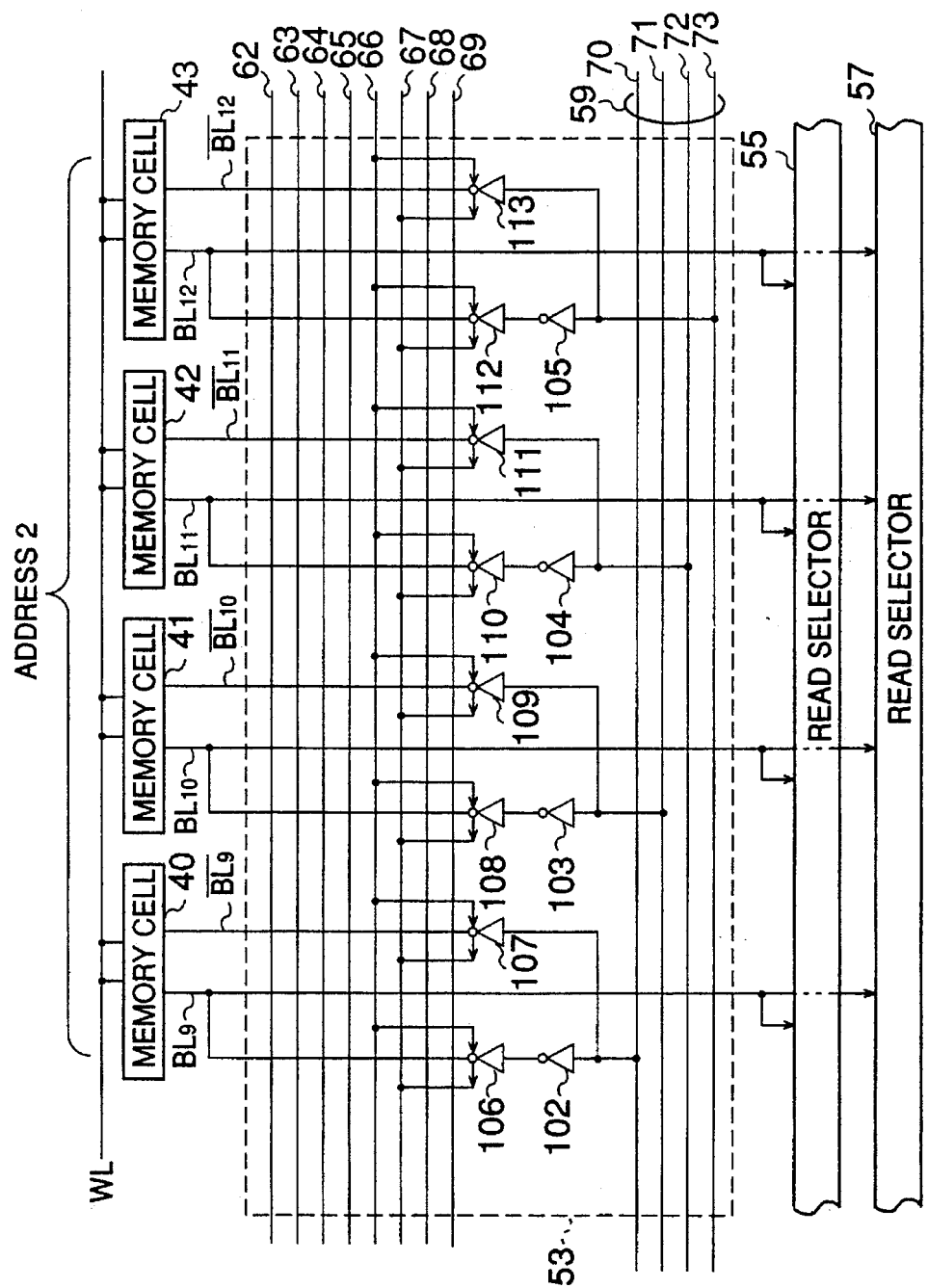
FIG. 9 is a block diagram of a third part of the write selector used in the first embodiment of the present invention.

As shown in FIG. 9, the data register shown in FIG. 5 includes bit line selecting lines 66 and 67 used to select bit lines $BL_9$, $/BL_9$, $BL_{10}$, $/BL_{10}$, $BL_{11}$, $/BL_{11}$, $BL_{12}$ and $/BL_{12}$, these bit lines being connected to the memory cells 40, 41, 42 and 43 having address 2.

Figure 10:
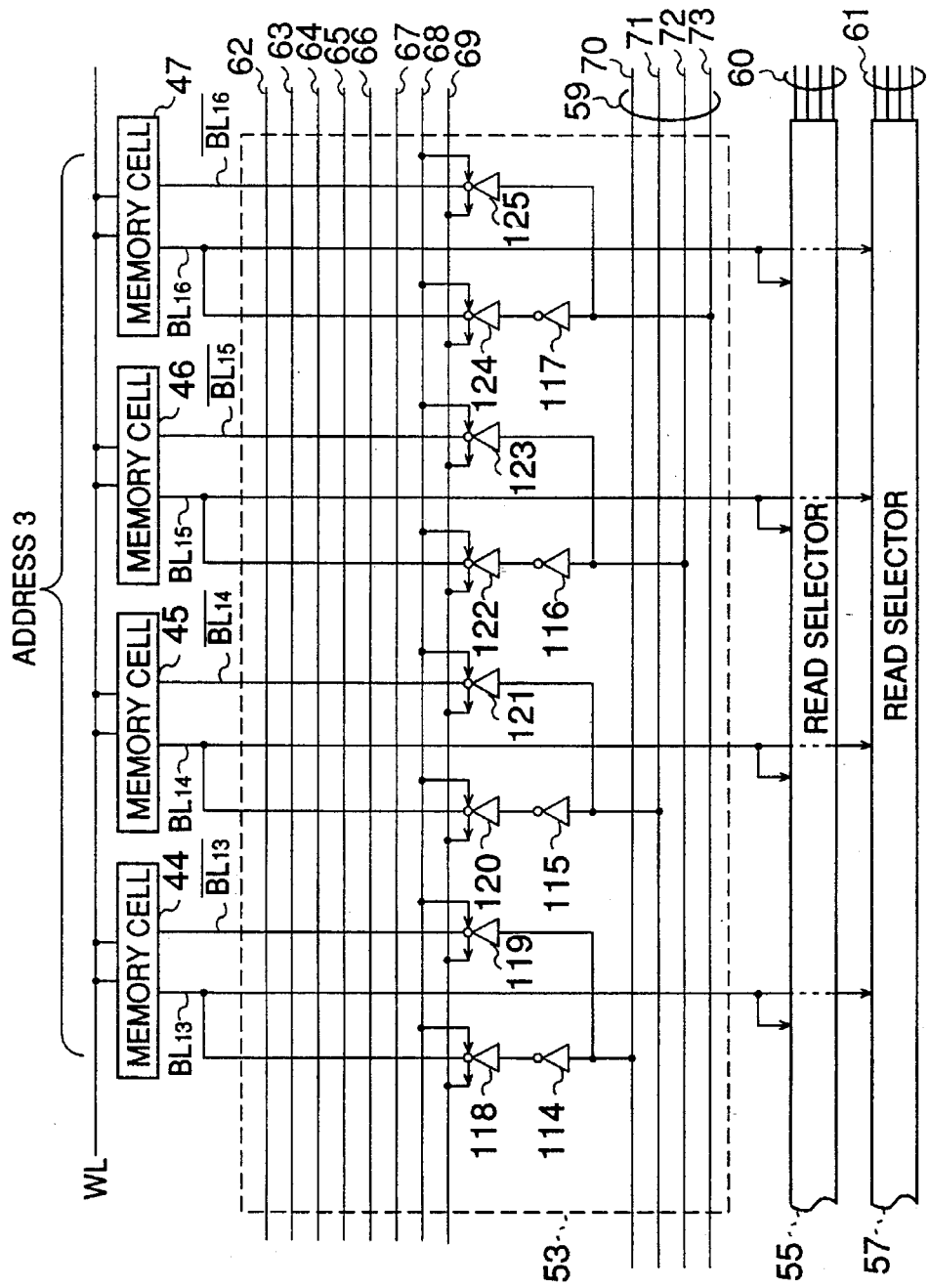
FIG. 10 is a block diagram of a fourth part of the write selector used in the first embodiment of the present invention.

As shown in FIG. 10, the data register shown in FIG. 5 includes bit line selecting lines 68 and 69 used to select bit lines $BL_{13}$, $/BL_{13}$, $BL_{14}$, $/BL_{14}$, $BL_{15}$, $/BL_{15}$, $BL_{16}$ and $/BL_{16}$, these bit lines being connected to the memory cells 44, 45, 46 and 47 having address 3.

As shown in FIGS. 7 through 10, write buses 70–73 forming the write bus 59 are provided. Further, the configuration shown in FIG. 7 includes inverters 74–81, clocked CMOS inverters 82–89 of a CMOS structure with a transfer gate function. The configuration shown in FIG. 8 includes inverters 90–93 and clocked CMOS inverters 94–100. The configuration shown in FIG. 9 includes inverters 102–105 and clocked CMOS inverters 106–113. The configuration shown in FIG. 10 includes inverters 114–117 and clocked CMOS inverters 118–125.

FIGS. 11 through 14 show segmented parts of the read selector 55. As shown in these figures, the read selector 55 includes bit line selecting lines 126 through 129. The bit line selecting line 126 is used to select the bit lines $BL_1$, $BL_2$, $BL_3$ and $BL_4$ connected to the memory cells 32, 33, 34 and 35 specified by address 0. The bit line selecting line 127 is used to select the bit lines $BL_5$, $BL_6$, $BL_7$ and $BL_8$ connected to the memory cells 36, 37, 38 and 39 specified by address 1. The bit line selecting line 128 is used to select the bit lines $BL_9$, $BL_{10}$, $BL_{11}$ and $BL_{12}$ connected to the memory cells 40, 41, 42 and 43 specified by address 2. The bit line selecting line 129 is used to select the bit lines $BL_{13}$, $BL_{14}$, $BL_{15}$ and $BL_{16}$ connected to the memory cells 44, 45, 46 and 47 specified by address 3. Bus lines 130–133 form the read bus 55.

Figure 11:
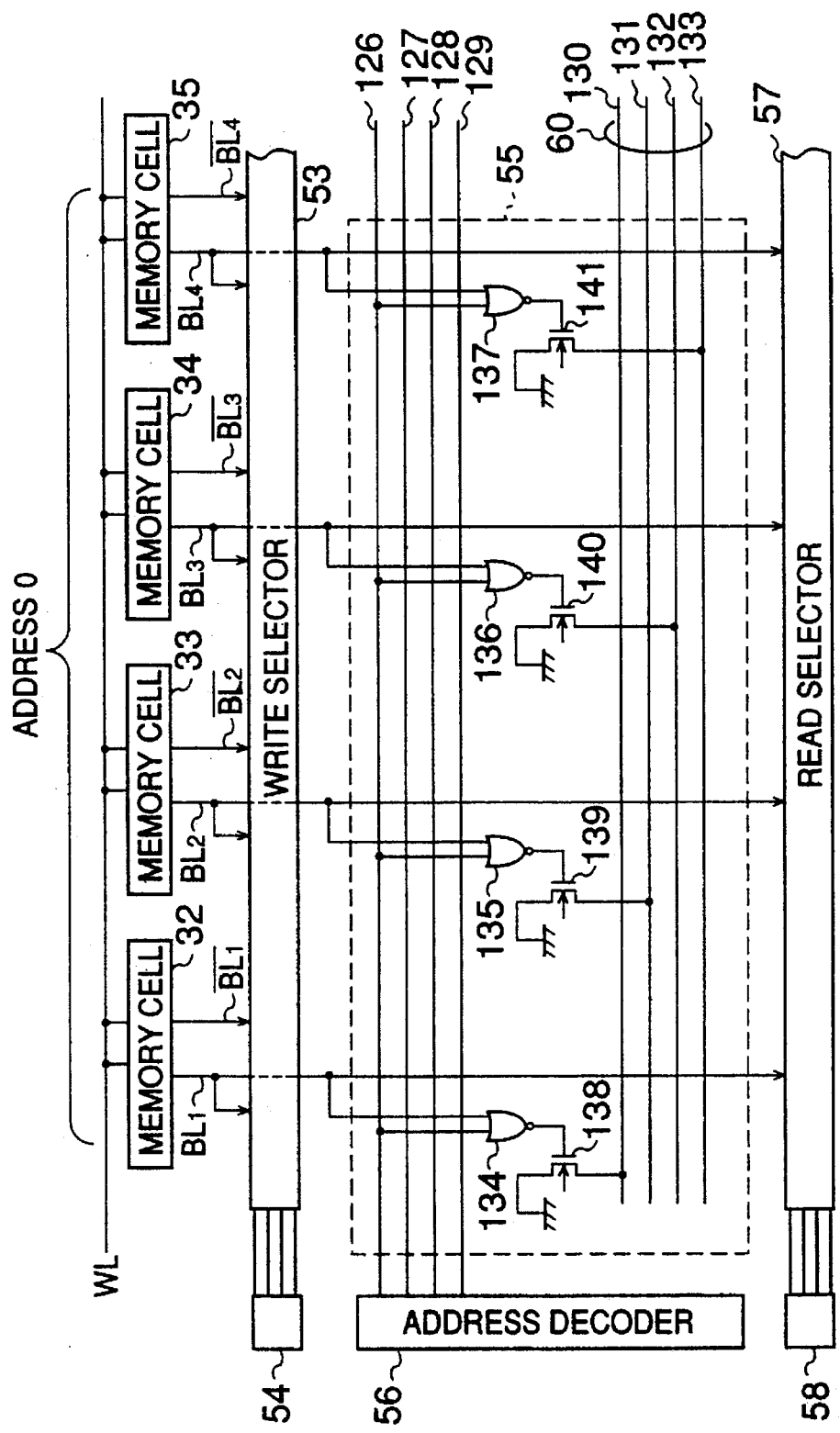
FIG. 11 is a block diagram of a first part of a first read selector shown in FIG. 5.
Figure 12:
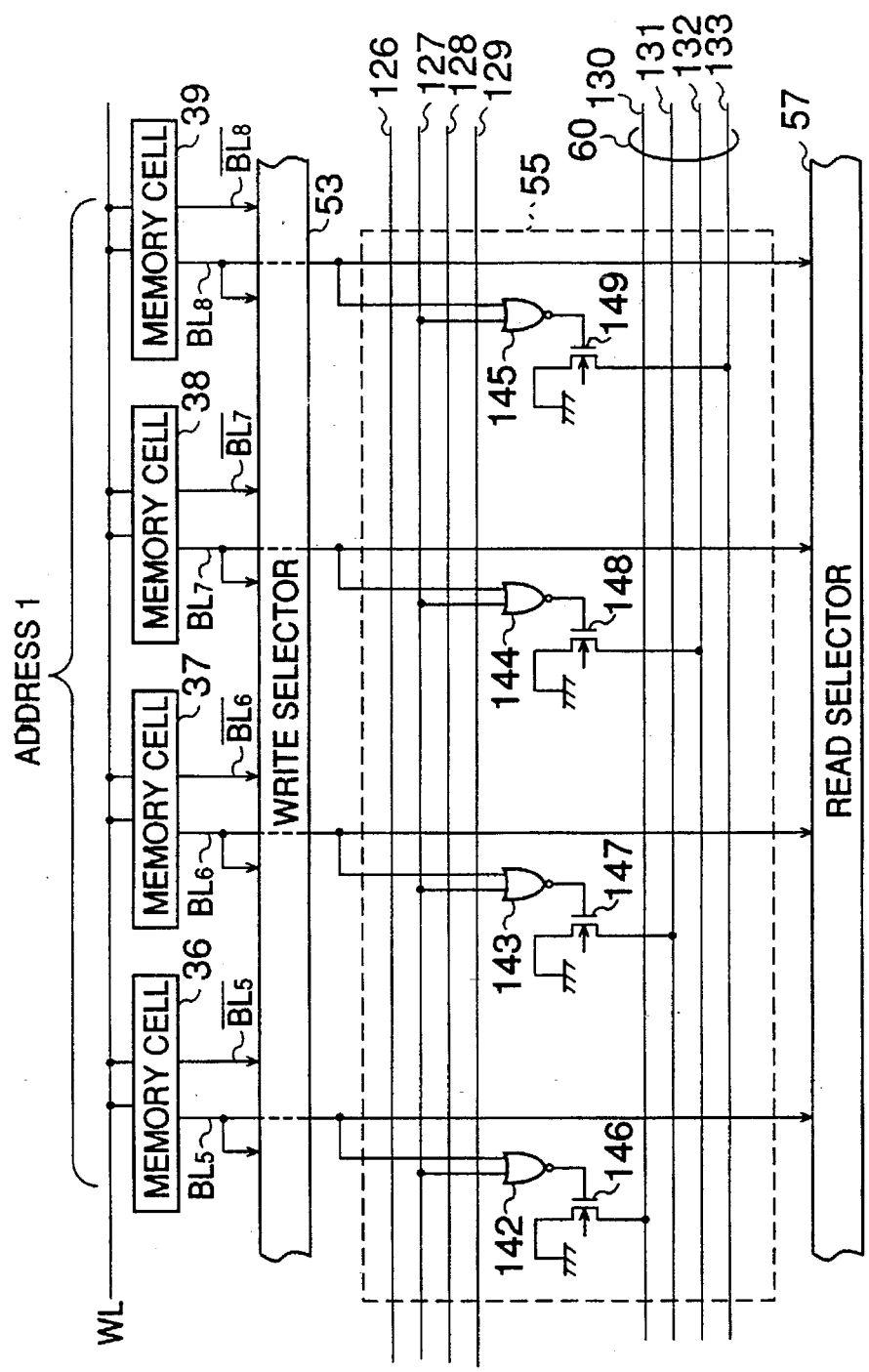
FIG. 12 is a block diagram of a second part of the first read selector shown in FIG. 5.
Figure 13:
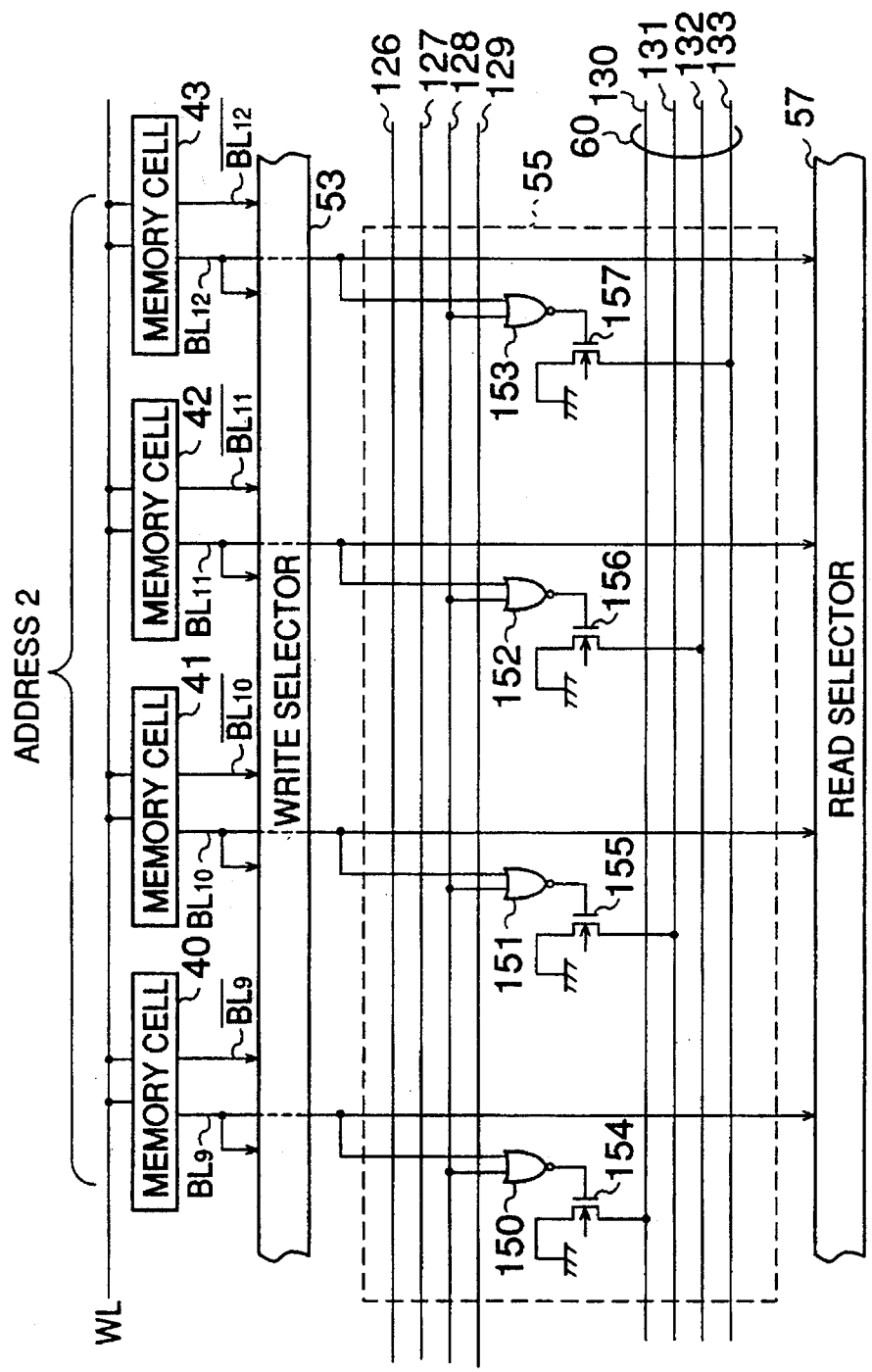
FIG. 13 is a block diagram of a third part of the first read selector shown in FIG. 5.
Figure 14:
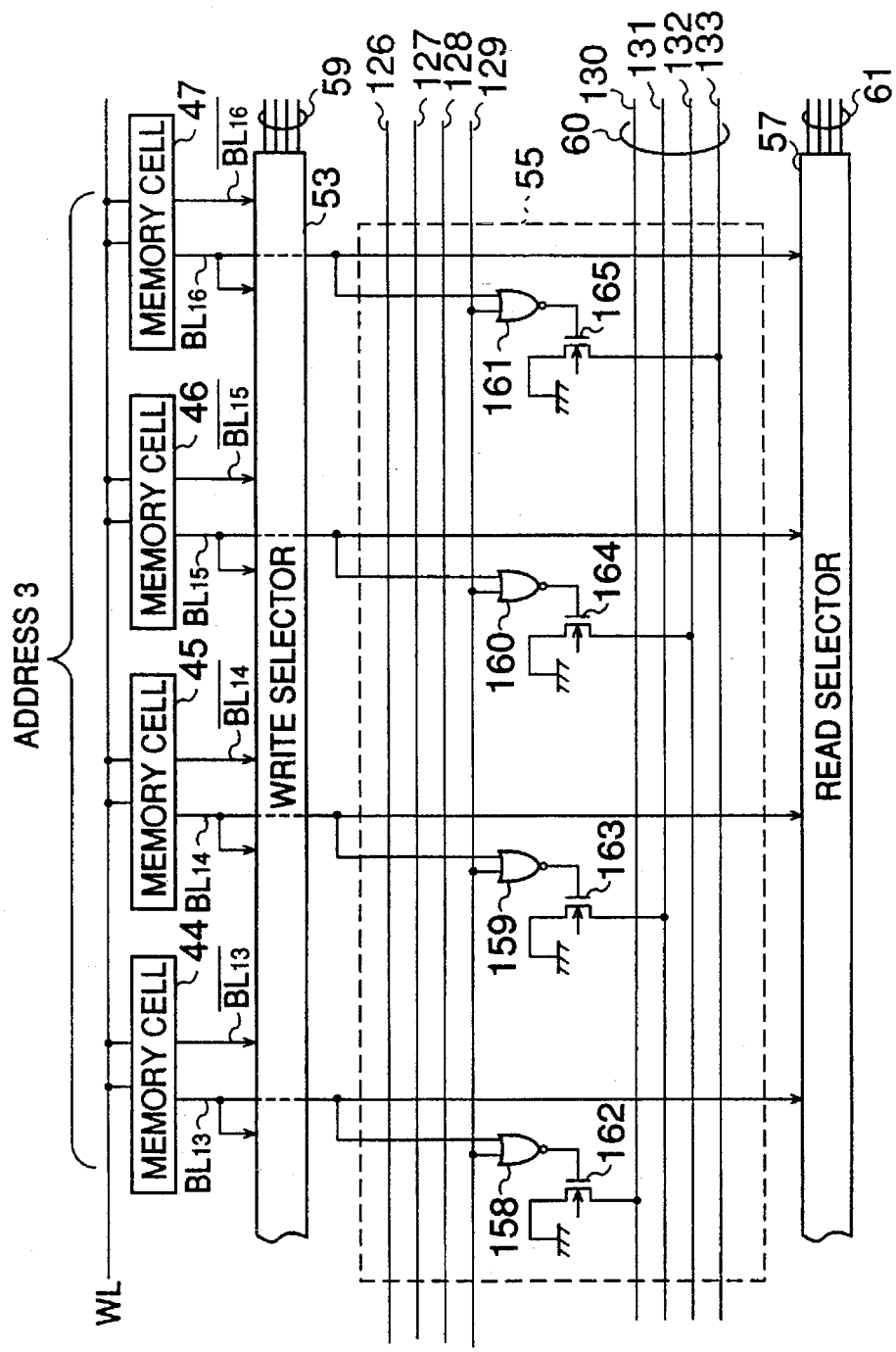
FIG. 14 is a block diagram of a fourth part of the first read selector shown in FIG. 5.

As shown in FIG. 11, the read selector 55 includes NOR circuits 134 through 137 and nMOS transistors 138–141. As shown in FIG. 12, the read selector 55 includes NOR circuits 142–145 and nMOS transistors 146–149. As shown in FIG. 13, the read selector 55 includes NOR circuits 150–153 and nMOS transistors 154–157. As shown in FIG. 14, the read selector 55 includes NOR circuits 158–161 and nMOS transistors 162–165.

FIGS. 15 through 19 show segmented parts of the read selector 57. As shown in these figures, the read selector 57 includes bit line selecting lines 166 through 169. The bit line selecting line 166 is used to select the bit lines $BL_1$, $BL_2$, $BL_3$ and $BL_4$ connected to the memory cells 32, 33, 34 and 35 specified by address 0. The bit line selecting line 167 is used to select the bit lines $BL_5$, $BL_6$, $BL_7$ and $BL_8$ connected to the memory cells 36, 37, 38 and 39 specified by address 1. The bit line selecting line 168 is used to select the bit lines $BL_9$, $BL_{10}$, $BL_{11}$ and $BL_{12}$ connected to the memory cells 40, 41, 42 and 43 specified by address 2. The bit line selecting line 169 is used to select the bit lines $BL_{13}$, $BL_{14}$, $BL_{15}$ and $BL_{16}$ connected to the memory cells 44, 45, 46 and 47 specified by address 3. Bus lines 170–173 form the read bus 61.

Figure 15:
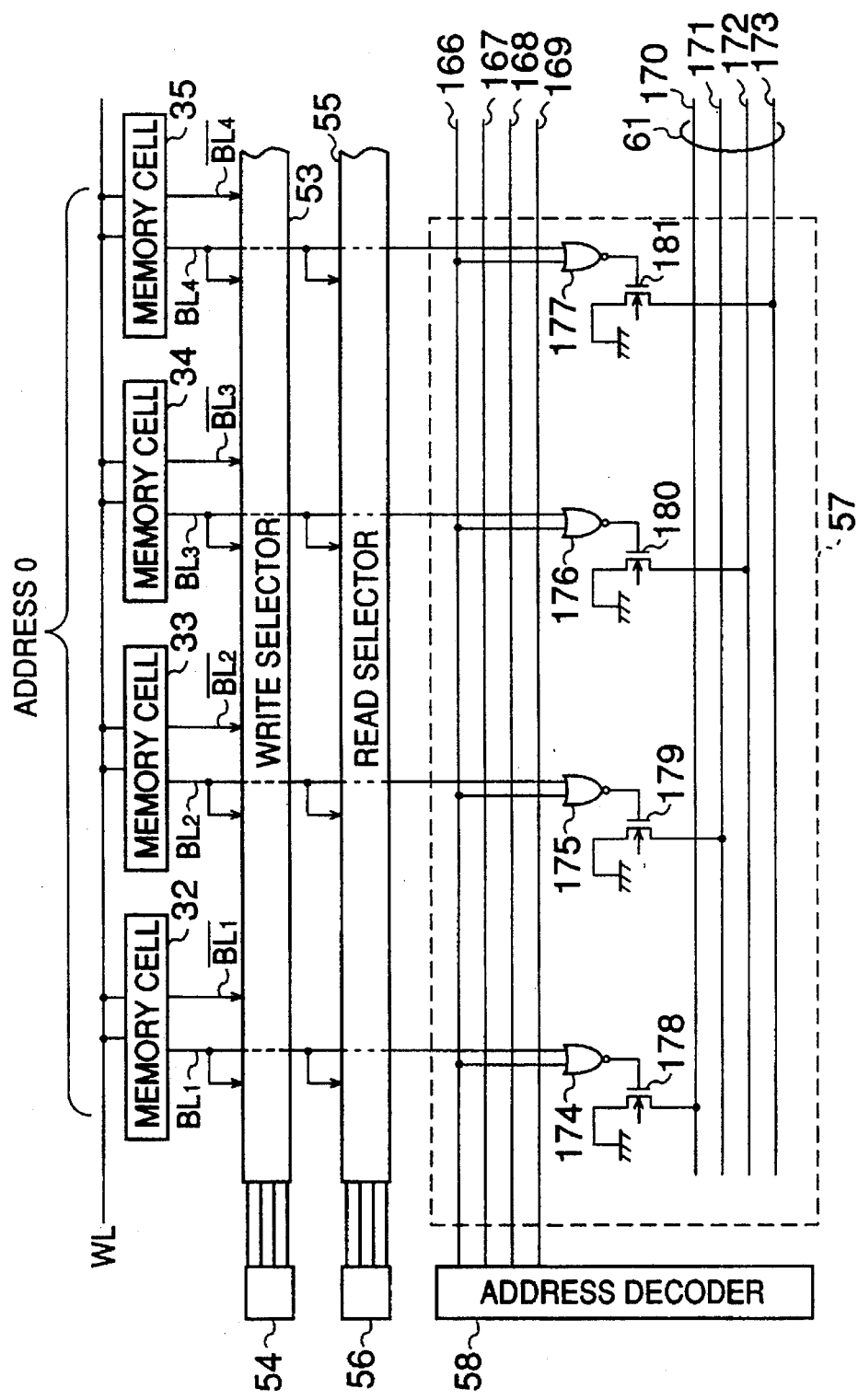
FIG. 15 is a block diagram of a first part of a second read selector shown in FIG. 5.
Figure 16:
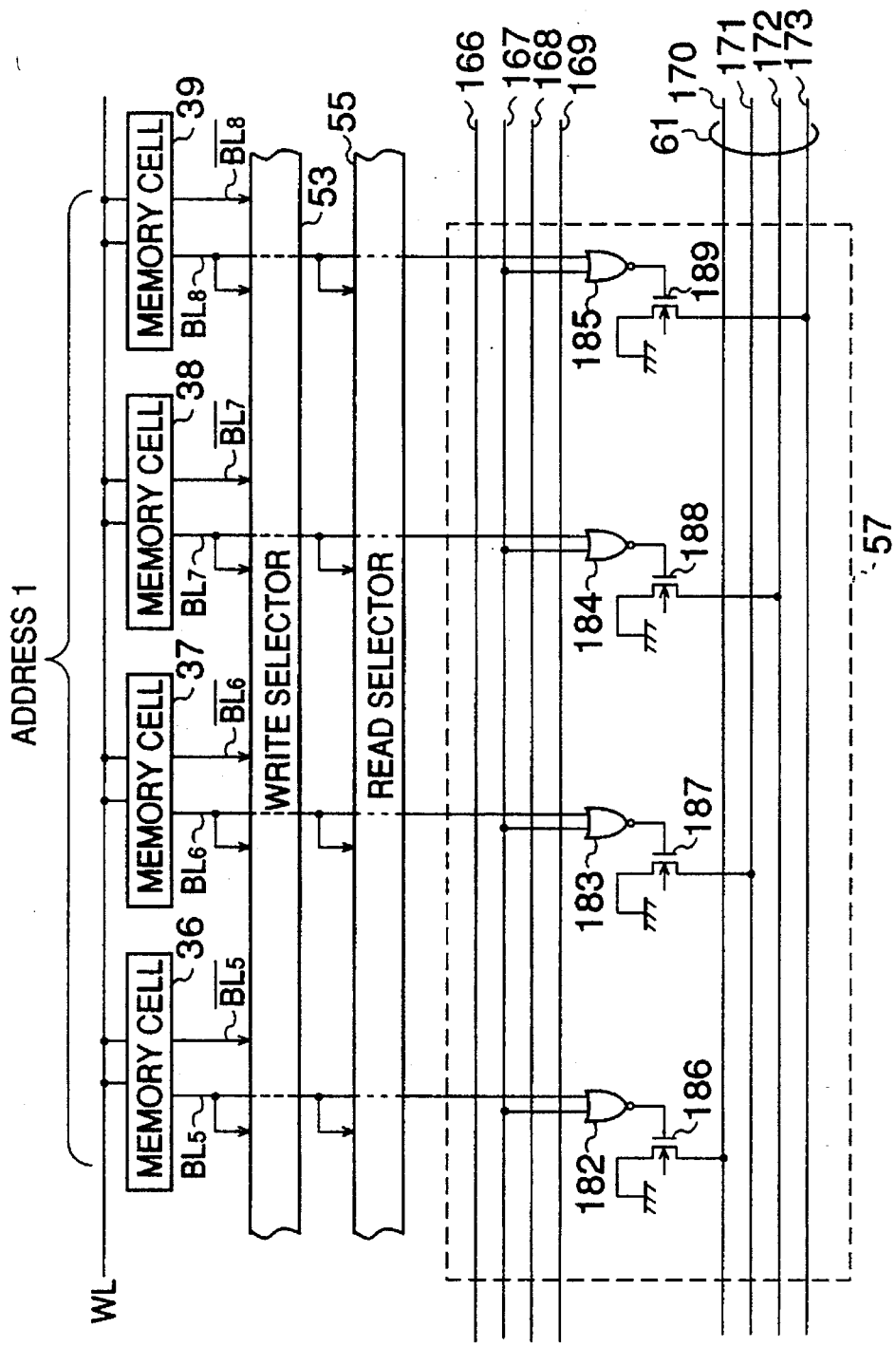
FIG. 16 is a block diagram of a second part of the second read selector shown in FIG. 5.
Figure 17:
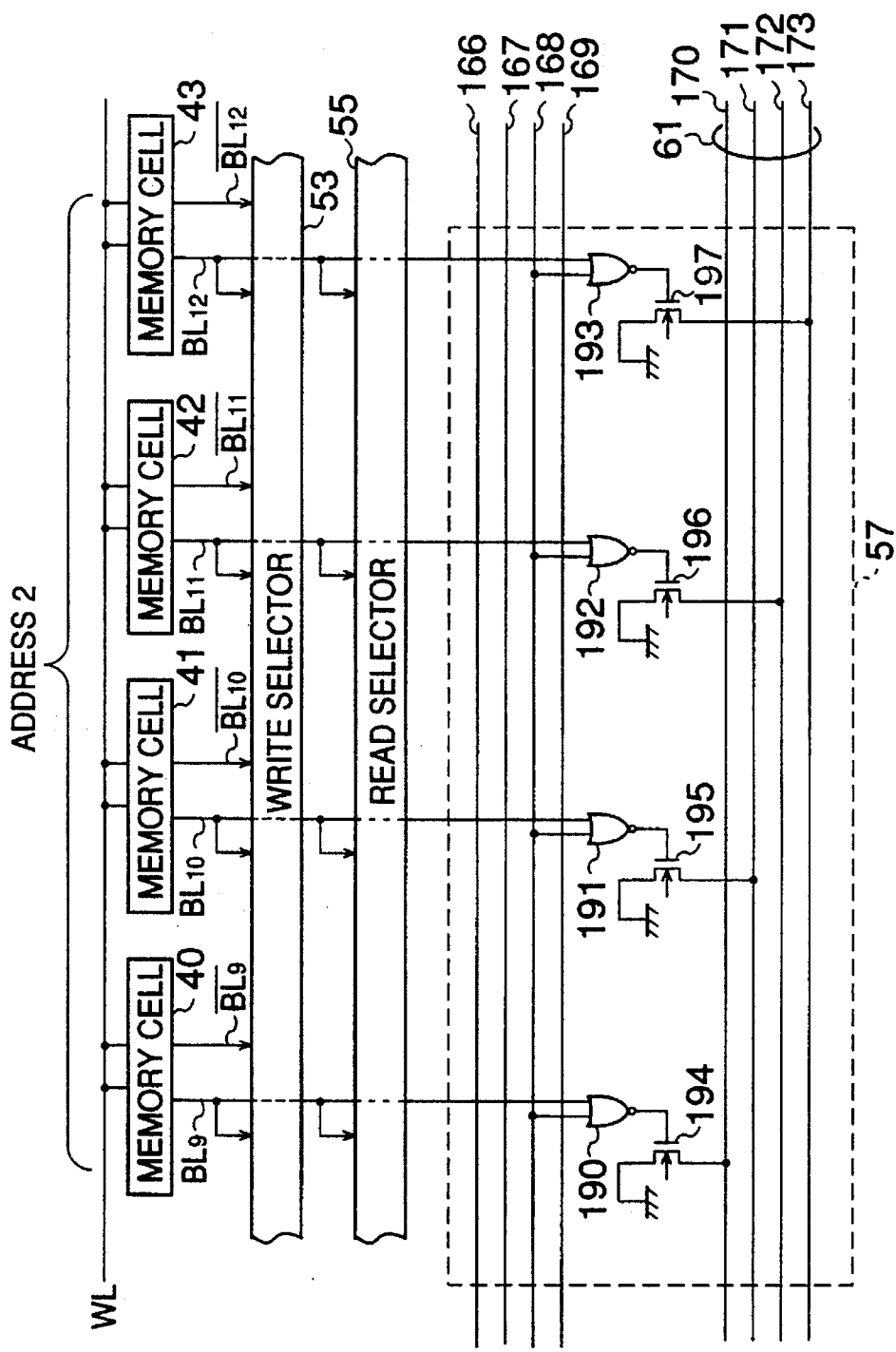
FIG. 17 is a block diagram of a third part of the second read selector shown in FIG. 5.
Figure 18:
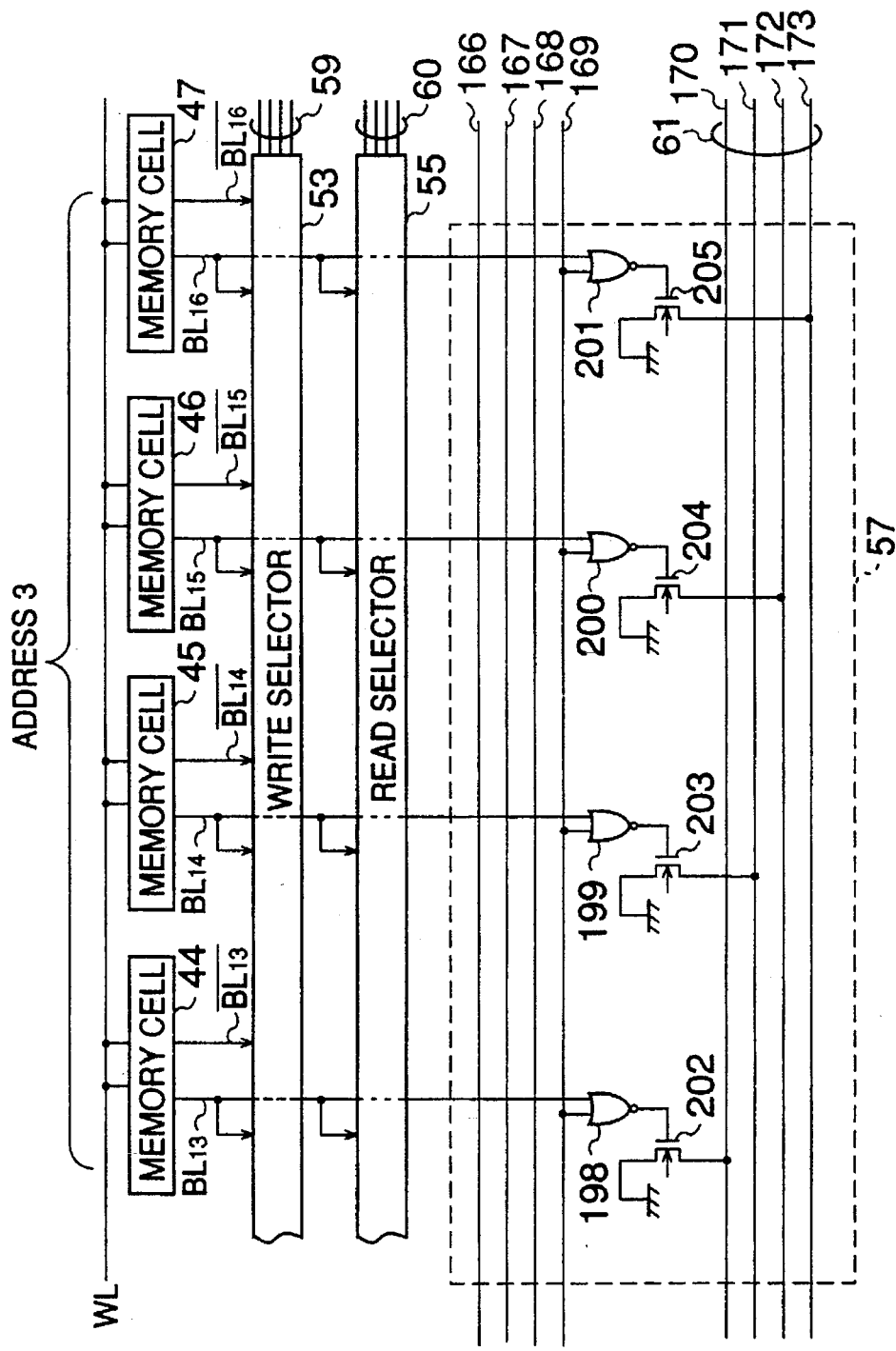
FIG. 18 is a block diagram of a fourth part of the second read selector shown in FIG. 5.

As shown in FIG. 15, the read selector 57 includes NOR circuits 174 through 177 and nMOS transistors 178–181. As shown in FIG. 16, the read selector 57 includes NOR circuits 182–185 and nMOS transistors 186–189. As shown in FIG. 17, the read selector 57 includes NOR circuits 190–193 and nMOS transistors 194–197. As shown in FIG. 18, the read selector 57 includes NOR circuits 198–201 and nMOS transistors 202–205.

Figure 19:
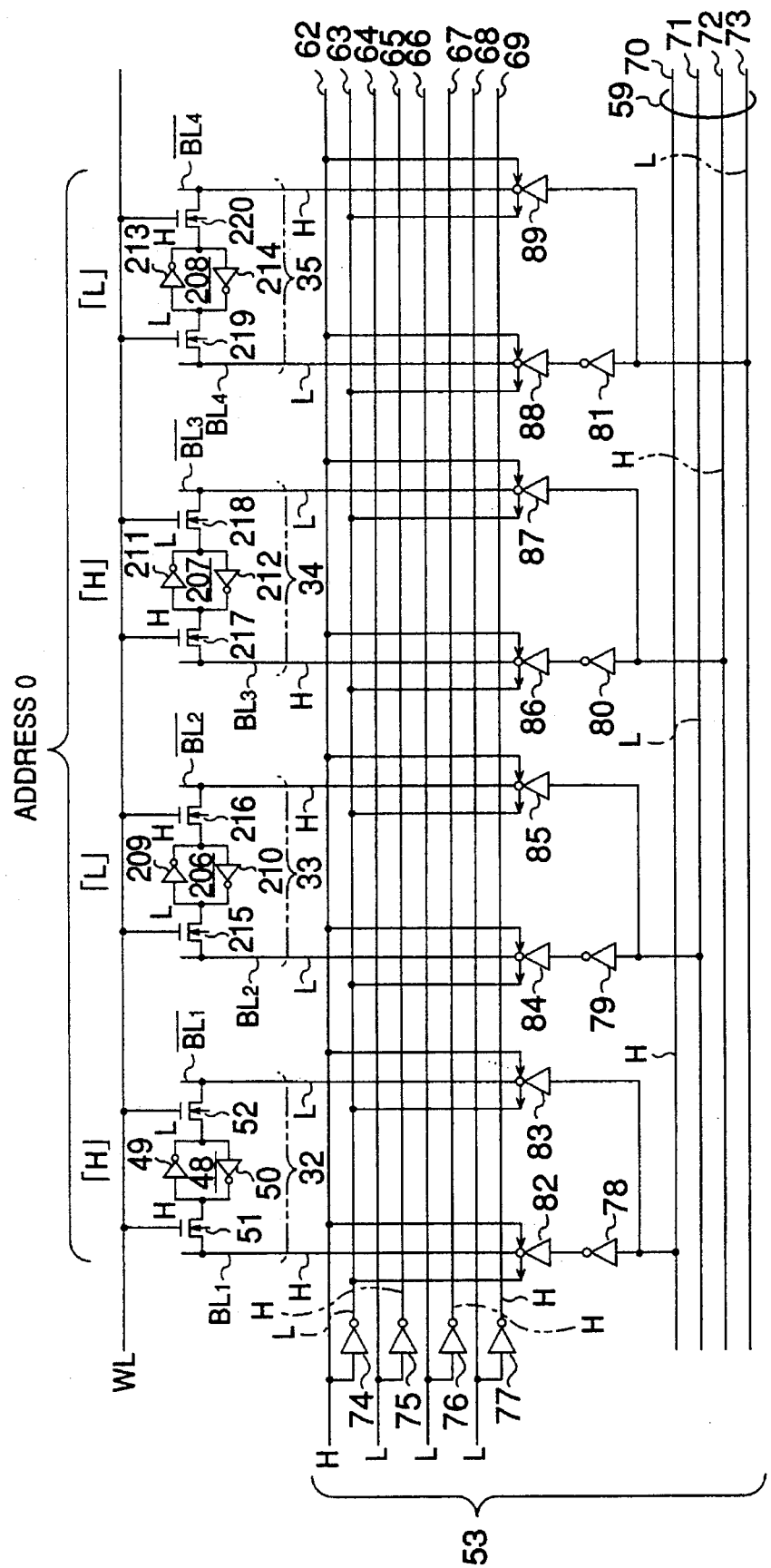
FIG. 19 is a block diagram showing the operation of the write selector.

FIG. 19 shows the operation of the write selector 53, and more particularly an operation in which the memory cells 32–35 specified by address 0 are selected, and high, low, high and low data values are written into the memory cells 32, 33, 34 and 35, respectively. In the memory cells 32–35, reference numbers 206–208 indicate flip-flops, reference numbers 209–214 indicate inverters, and reference numbers 215–220 indicate nMOS transistors.

In the above write operation, the word line WL is switched to the high level, and hence the nMOS transistors of the memory cells 32–47 serving as the transfer gates such as nMOS transistors 51, 52, 215–220 are turned ON. Further, the bus lines 70, 71, 72 and 73 are set to the high, low, high and low levels, respectively. The bit line selecting lines 62, 63, 64, 65, 66, 67, 68 and 69 are set to the high, low, low, high, low, high, low and high levels, respectively.

That is, the clocked CMOS inverters 82–89 are activated, and the clocked CMOS inverters 94–101, 106–113, 118–125 are made inactive. As a result, the memory cells 32–35 of address 0 are selected, while the memory cells 36–47 of addresses 1, 2 and 3 are not selected.

Hence, in the above case, the bit lines $BL_1$, $/BL_1$, $BL_2$, $/BL_2$, $BL_3$, $/BL_3$, $BL_4$, $/BL_4$ are set as follows:

| | |
|---|---|
| $BL_1 = H$, | $/BL_1 = L$ |
| $BL_2 = L$, | $/BL_2 = H$ |
| $BL_3 = H$, | $/BL_3 = L$ |
| $BL_4 = L$, | $/BL_4 = H$ | where H denotes high level, and L denotes low level.

As a result, data H, L, H and L are written into the memory cells 32, 33, 34 and 35, respectively.

Figure 20:
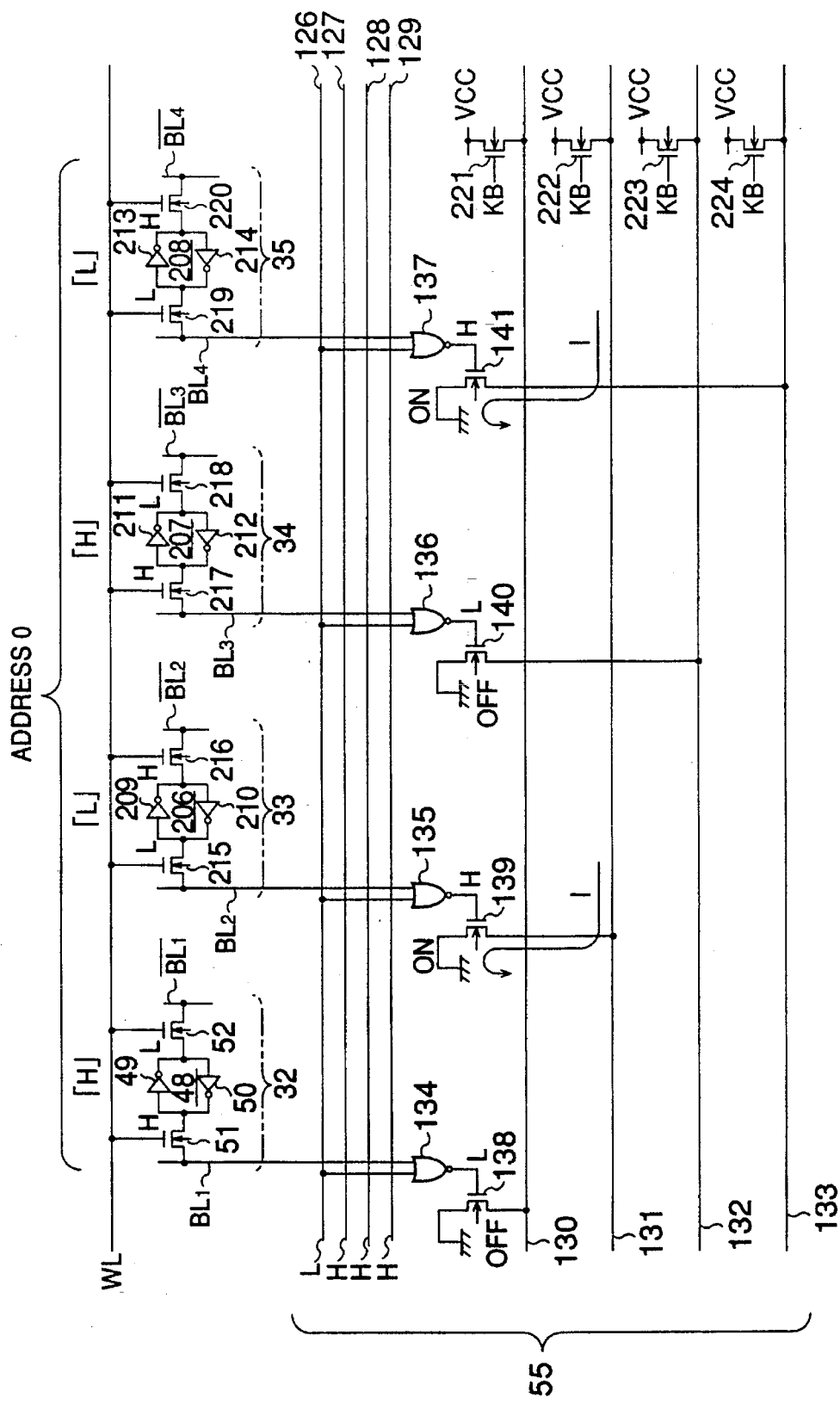
FIG. 20 is a block diagram showing the operation of the first read selector.

FIG. 20 shows the operation of the read selector 55, and more particularly an operation in which data are read from the memory cells 32–35 of address 0 via the read selector 55 in a case where data H, L, H and L are stored in the memory cells 32, 33, 34 and 35, respectively. In the read selector 55, reference numbers 221–224 denote nMOS transistors serving as loads, and symbol KB denotes a control clock signal.

When data are read from the memory cells 32–35, the bit lines $BL_1$, $/BL_1$–$BL_{16}$ and $/BL_{16}$ are reset to the high level via the loads, and the word line WL is switched to the high level. Hence, the nMOS transistors of the memory cells 32–35 functioning as the transfer gates, such as nMOS transistors 51, 52, 215–220, are turned ON. Thus, the bit lines $BL_1$, $/BL_1$, $BL_2$, $/BL_2$, $BL_3$, $/BL_3$, $BL_4$, $/BL_4$ are set as follows:

| | |
|---|---|
| $BL_1 = H$, | $/BL_1 = L$ |
| $BL_2 = L$, | $/BL_2 = H$ |
| $BL_3 = H$, | $/BL_3 = L$ |
| $BL_4 = L$, | $/BL_4 = H$. |

In the above case, the control clock signal KB is set to the high level, and the bus lines 130–133 are reset to the high level. Further, the bit line selecting line 126 is switched to the low level, and the bit line selecting lines 127–129 are set to the high level. As a result, the output signals of the NOR circuits 134, 135, 136 and 137 are switched to L, H, L and H, respectively. The nMOS transistors 138, 139, 140 and 141 are turned OFF, ON, OFF and ON, respectively. The output signals of the NOR circuits 142–145, 150–153, 158–161 respectively provided for the memory cells 36–47 are switched to the low level, and the output signals of the nMOS transistors 146–149, 154–157 and 162–165 are turned OFF.

In this case, current I flows in the nMOS transistor 139 from the bus line 131 to the ground, and current I flows in the nMOS transistor 141 from the bus line 133 to the ground. However, current I does not flow in the nMOS transistor 138 from the bus line 130 to the ground, and current I does not flow in the nMOS transistor 140 from the bus line 132 to the ground. Hence, in this case, the bit lines 130, 131, 312 and 133 are set to H, L, H and L, respectively, and data stored in the memory cells 32–35 can be read therefrom. The read selector 57 operates in the same manner as the read selector 55.

According to the first embodiment of the present invention, the write operation via the write selector 53 and two read operations via the read selectors 55 and 57 can be simultaneously performed under the condition that the same address is not selected. For example, the write operation on the memory cells 32–35 specified by address 0 via the write selector 53, the first read operation on the memory cells 36–39 specified by address 1 via the read selector 55, and the second read operation on the memory cells 44–47 specified by address 3 via the read selector 57 can be simultaneously performed. According to the first embodiment of the present invention, each memory cell has two nMOS transistors functioning as transfer gates, whereby the area occupied by one memory cell can be reduced and the chip size can be diminished.

Figure 21:
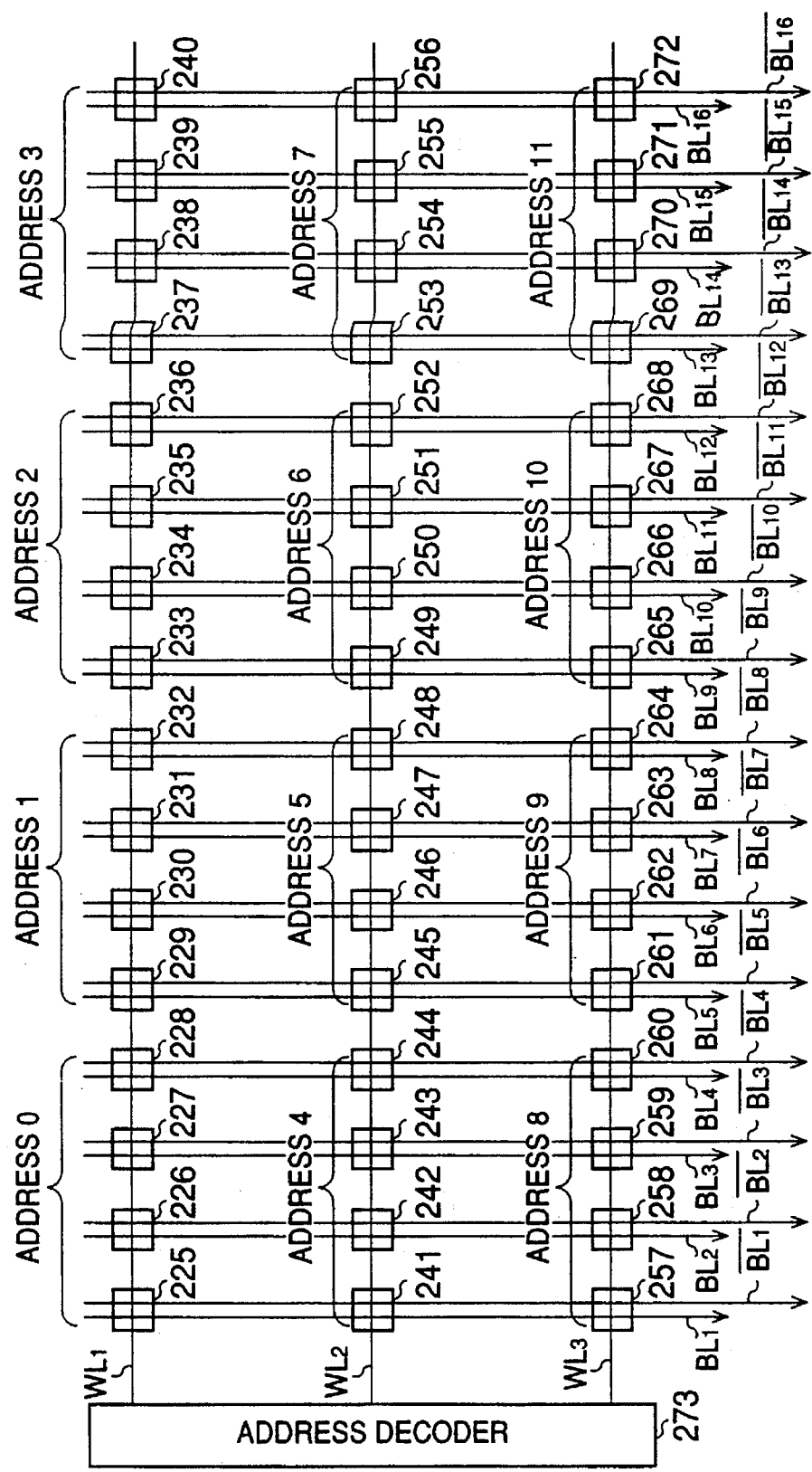
FIG. 21 is a block diagram of a second embodiment of the present invention.
Figure 22:
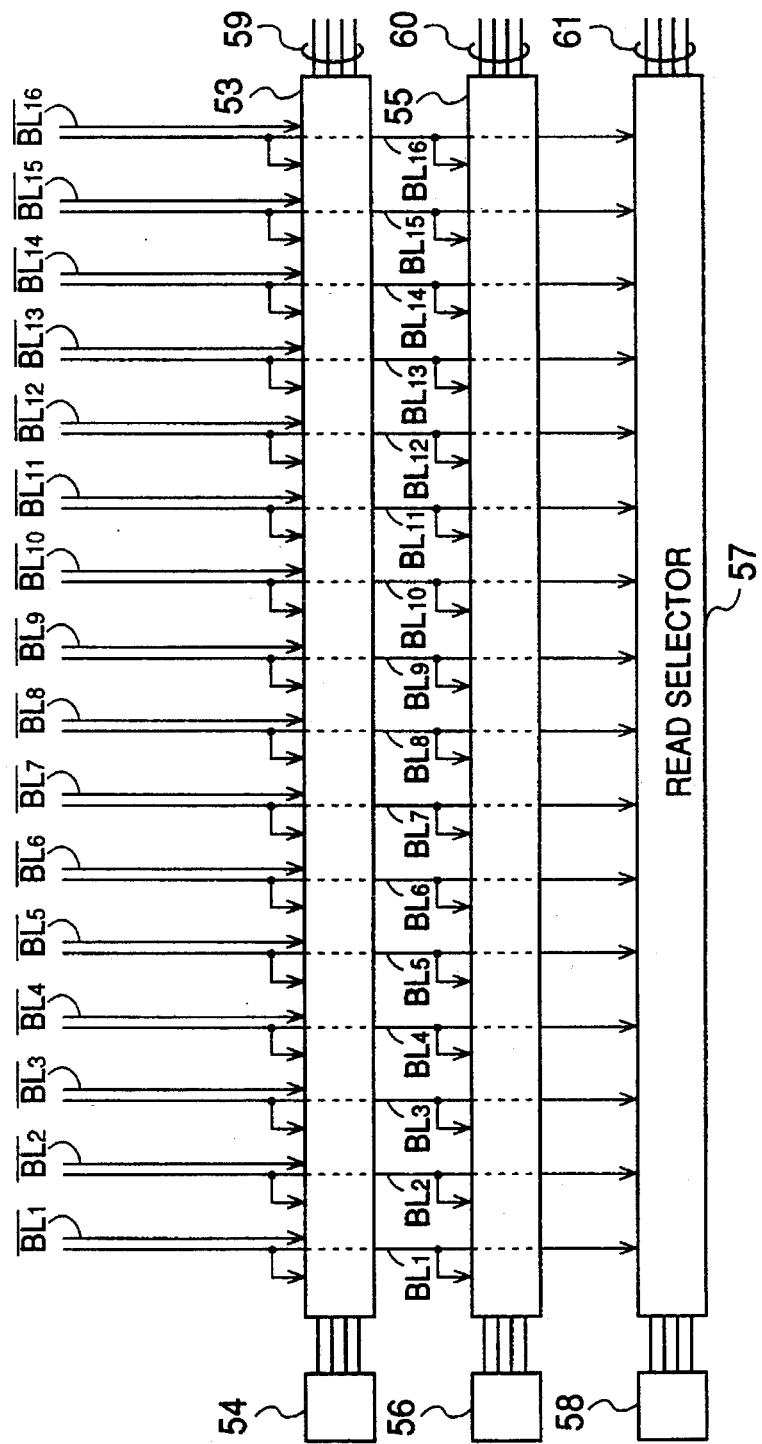
FIG. 22 is a block diagram of the second embodiment of the present invention.

A description will now be given, with reference to FIGS. 21 and 22, of a second embodiment of the present invention. FIGS. 21 and 22 show an essential part of a data register in a CPU of a one-chip microprocessor. The configuration shown in FIGS. 21 and 22 is substituted for the configuration shown in FIG. 3.

The data register shown in FIGS. 21 and 22 includes memory cells 225–228 of address 0, memory cells 229–232 of address 1, memory cells 233–236 of address 2 and memory cells 237–240 of address 3. Further, the data register includes memory cells 241–244 of address 4, memory cells 245–248 of address 5, memory cells 249–252 of address 6, and memory cells 253–256 of address 7. Furthermore, the data register includes memory cells 257–260 of address 8, memory cells 261–264 of address 9, memory cells 265–268 of address 10, and memory cells 269–272 of address 11.

The data register includes a word line $WL_1$ used to perform ON/OFF control of the transfer gates of the memory cells 225–240, a word line $WL_2$ used to perform ON/OFF control of the transfer gates of the memory cells 241–256, and a word line $WL_3$ used to perform ON/OFF control of the transfer gates of the memory cells 257–272. Further, the data register includes an address decoder 273 which selects one of the word lines $WL_1$–$WL_3$, and bit lines $BL_1$, $/BL_1$–$BL_{16}$ and $/BL_{16}$. The memory cells 225–272 have an identical structure, and has an SRAM cell structure as shown in FIG. 6. More specifically, the bit lines $BL_1$–$/BL_4$ are commonly provided for the memory cells of addresses 0, 4 and 8, so that these cells are grouped (in a bank). In other words, there are three blocks of memory cells respectively related to the word lines $WL_1$, $WL_2$ and $WL_3$, and a pair of bit lines is commonly connected to these three blocks. The other bit lines are provided in the same manner as the bit lines $BL_1$–/$BL_4$.

Further, the data register includes the aforementioned write selector 53, the read selector 55, the read selector 57, the address decoders 54, 56 and 58, the write bus 59, the read bus 60 and the read bus 61, these parts being used in the first embodiment of the present invention.

According to the second embodiment of the present invention, the write operation via the write selector 53 and the two read operations via the read selectors 55 and 57 can be simultaneously performed under the condition that two or three of the word lines $WL_1$–$WL_3$ are not concurrently selected and the same address is not selected. For example, in a case where the word line $WL_1$ is selected and the word lines $WL_2$ and $WL_3$ are not selected, the write operation on the memory cells 225–228 specified by address 0 via the write selector 53, the first read operation on the memory cells 229–232 specified by address 1 via the read selector 55, and the second read operation on the memory cells 233–236 specified by address 2 via the read selector 57 can be simultaneously performed. By way of another example, in a case where the word line $WL_2$ is selected and the word lines $WL_1$ and $WL_3$ are not selected, the write operation on the memory cells 245–248 specified by address 5 via the write selector 53, the first read operation on the memory cells 249–252 specified by address 6 via the read selector 55, and the second read operation on the memory cells 253–256 specified by address 7 via the read selector 57 can be simultaneously performed.

According to the second embodiment of the present invention, each memory cell two nMOS transistors functioning as transfer gates, whereby the area occupied by one memory cell can be reduced and the chip size can be diminished.

The present invention is not limited to the specifically disclosed embodiments, and variations and modifications may be made without departing from the scope of the present invention.

What is claimed is:

1. A data register structure, comprising:

a plurality of memory cells connected to a word line and grouped into groups assigned to respective different addresses, each of the memory cells being connected to a pair of first and second bit lines;

write control means, connected to both the first bit lines and the second bit lines extending from the memory cells, for controlling potentials of the first and second bit lines connected to the memory cells into which data is to be written; and read control means, connected to only one of: (a) the first bit lines and (b) the second bit lines, for detecting potentials of only one of: (a) the first bit lines and (b) the second bit lines connected to the memory cells from which data is to be read.

2. The data register structure as claimed in claim 1, wherein each of the memory cells comprises:

first and second inverters connected in a ring formation;

a first transfer gate selectively connecting the first bit line to the first and second inverters on the basis of the potential of said word line; and a second transfer gate selectively connecting the second bit line to the first and second inverters on the basis of the potential of said word line.

3. The data register structure as claimed in claim 1, wherein:

said write control means comprises a write address decoder circuit which allows an access to the memory cells belonging to one of the groups, and said read control means comprises a read address decoder circuit which allows an access to the memory cells belonging to one of the groups.

4. A data register structure, comprising:

a plurality of blocks, each having a plurality of memory cells connected to a word line and grouped into groups assigned to respective different addresses, each of the memory cells being connected to a pair of first and second bit lines, the first and second bit lines being connected to and commonly used by at least two blocks;

write control means, connected to both the first bit lines and the second bit lines extending from the memory cells, for controlling potentials of the first and second bit lines connected to the memory cells into which data is to be written; and read control means, connected to only one of: (a) the first bit lines and (b) the second bit lines, for detecting potentials of only one of: (a) the first bit lines and (b) the second bit lines connected to the memory cells from which data is to be read.

5. The data register structure as claimed in claim 4, wherein each of the memory cells comprises:

first and second inverters connected in a ring formation;

a first transfer gate selectively connecting the first bit line to the first and second inverters on the basis of the potential of said word line; and a second transfer gate selectively connecting the second bit line to the first and second inverters on the basis of the potential of said word line.

6. A semiconductor integrated circuit device, comprising:

a data register for storing data; and an operation unit for performing an operation on two data items read from the data register and writing an operation result into the data register, wherein said data register comprises:

a plurality of memory cells connected to a word line and grouped into groups assigned to respective different addresses, each of the memory cells being connected to a pair of first and second bit lines, write control means, connected to both the first bit lines and the second bit lines extending from the memory cells, for controlling potentials of the first and second bit lines connected to the memory cells into which data is to be written, and read control means, connected to only one of: (a) the first bit lines and (b) the second bit lines, for detecting potentials of only one of the corresponding: (a) the first bit lines and (b) the second bit lines connected to the memory cells from which data is to be read.

7. The semiconductor integrated circuit device as claimed in claim 6, wherein each of the memory cells comprises:

first and second inverters connected in a ring formation;

a first transfer gate selectively connecting the first bit line to the first and second inverters on the basis of the potential of said word line; and a second transfer gate selectively connecting the second bit line to the first and second inverters on the basis of the potential of said word line.

8. A semiconductor integrated circuit device, comprising:

a data register for storing data;

an operation unit for performing an operation on two data items read from the data register and writing an operation result into the data register, wherein said data register comprises:
a plurality of blocks, each having a plurality of memory cells connected to a word line and grouped into groups assigned to respective different addresses, each of the memory cells being connected to a pair of first and second bit lines, the first and second bit lines being connected to and commonly used by at least two blocks,
write control means, connected to both the first bit lines and the second bit lines extending from the memory cells, for controlling potentials of the first and second bit lines connected to the memory cells into which data is to be written, and
read control means, connected to only one of: (a) the first bit lines and (b) the second bit lines, for detecting potentials of only one of the corresponding: (a) the first bit lines and (b) the second bit lines connected to the memory cells from which data is to be read.

9. The semiconductor integrated circuit device as claimed in claim 8, wherein each of the memory cells comprises:
first and second inverters connected in a ring formation;
a first transfer gate selectively connecting the first bit line to the first and second inverters on the basis of the potential of said word line; and
a second transfer gate selectively connecting the second bit line to the first and second inverters on the basis of the potential of said word line.

10. A semiconductor integrated circuit device, comprising:
a processor; and
memory means for storing a program executed by the processor and data processed by the processor,
wherein said processor comprises:
a data register for storing data, and
an operation unit for performing an operation on two data items read from the data register and writing an operation result into the data register,
wherein said data register comprises:
a plurality of memory cells connected to a word line and grouped into groups assigned to respective different addresses, each of the memory cells being connected to a pair of first and second bit lines,
write control means, connected to both the first bit lines and the second bit lines extending from the memory cells, for controlling potentials of the first and second bit lines connected to the memory cells into which data is to be written, and
read control means, connected to only one of: (a) the first bit lines and (b) the second bit lines, for detecting potentials of only one of the corresponding: (a) the first bit lines and (b) the second bit lines connected to the memory cells from which data is to be read.

11. The semiconductor integrated circuit device as claimed in claim 10, wherein each of the memory cells comprises:
first and second inverters connected in a ring formation;
a first transfer gate selectively connecting the first bit line to the first and second inverters on the basis of the potential of said word line; and
a second transfer gate selectively connecting the second bit line to the first and second inverters on the basis of the potential of said word line.

12. A semiconductor integrated circuit device, comprising:
a processor; and
memory means for storing a program executed by the processor and data processed by the processor,
wherein said processor comprises:
a data register for storing data, and
an operation unit for performing an operation on two data items read from the data register and writing an operation result into the data register, and
wherein said data register comprises:
a plurality of blocks, each having a plurality of memory cells connected to a word line and grouped into groups assigned to respective different addresses, each of the memory cells being connected to a pair of first and second bit lines, the first and second bit lines being connected to and commonly used by at least two blocks,
write control means, connected to both the first bit lines and the second bit lines extending from the memory cells, for controlling potentials of the first and second bit lines connected to the memory cells into which data is to be written, and
read control means, connected to only one of: (a) the first bit lines and (b) the second bit lines, for detecting potentials of only one of: (a) the first bit lines and (b) the second bit lines connected to the memory cells from which data is to be read.

13. The semiconductor integrated circuit device as claimed in claim 12, wherein each of the memory cells comprises:
first and second inverters connected in a ring formation;
a first transfer gate selectively connecting the first bit line to the first and second inverters on the basis of the potential of said word line; and
a second transfer gate selectively connecting the second bit line to the first and second inverters on the basis of the potential of said word line.

* * * * *